US012575183B2

(12) United States Patent (10) Patent No.: US 12,575,183 B2
Basrur et al. (45) Date of Patent: Mar. 10, 2026

(54) DISPLAY DEVICE AND METHOD OF MANUFACTURING THE SAME

(71) Applicant: Samsung Display Co., LTD., Yongin-si (KR)

(72) Inventors: Veidhes Basrur, Yongin-si (KR); Jin Taek Kim, Yongin-si (KR); Ki Nyeng Kang, Yongin-si (KR); Yong Tae Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 371 days.

(21) Appl. No.: 18/317,327

(22) Filed: May 15, 2023

(65) Prior Publication Data

US 2024/0096903 A1 Mar. 21, 2024

(30) Foreign Application Priority Data

Sep. 16, 2022 (KR) ........................ 10-2022-0117376

(51) Int. Cl.
| | |
|---|---|
| *H10D 86/60* | (2025.01) |
| *H01L 23/00* | (2006.01) |
| *H01L 25/16* | (2023.01) |
| *H10D 86/01* | (2025.01) |
| *H10D 86/40* | (2025.01) |

(52) U.S. Cl.
CPC ............. *H10D 86/60* (2025.01); *H01L 24/05* (2013.01); *H01L 24/29* (2013.01); *H01L 24/32* (2013.01); *H01L 25/167* (2013.01); *H10D 86/0231* (2025.01); *H10D 86/441* (2025.01);

*H01L 2224/05573* (2013.01); *H01L 2224/29028* (2013.01); *H01L 2224/32225* (2013.01)

(58) Field of Classification Search
CPC ......... H10H 20/83–835; H10D 86/441; H10D 86/60
See application file for complete search history.

(56) References Cited

U.S. PATENT DOCUMENTS

| | | | |
|---|---|---|---|
| 6,531,392 B2 | 3/2003 | Song et al. | |
| 7,173,867 B2 | 2/2007 | Terzioglu | |
| 11,114,500 B2 * | 9/2021 | Lee .................... | H01L 25/0753 |
| 11,362,250 B2 | 6/2022 | Kim et al. | |
| 2021/0134877 A1 | 5/2021 | Kim et al. | |
| 2021/0225976 A1 | 7/2021 | Lee et al. | |
| 2021/0398956 A1 * | 12/2021 | Jung ..................... | C09D 11/50 |

(Continued)

FOREIGN PATENT DOCUMENTS

| | | |
|---|---|---|
| KR | 10-2020-0029861 | 3/2020 |
| KR | 10-2021-0054117 | 5/2021 |
| KR | 10-2021-0124564 | 10/2021 |

*Primary Examiner* — Evren Seven
(74) *Attorney, Agent, or Firm* — Womble Bond Dickinson (US) LLP

(57) ABSTRACT

A display device includes electrodes spaced apart from each other in a display area, an insulating layer disposed on the electrodes, light emitting elements disposed between the electrodes on the insulating layer, a signal line electrically connected to the light emitting elements, and a pad electrode electrically connected to the signal line, the pad electrode and the electrodes being disposed on a same layer in a non-display area. The insulating layer includes an opening exposing the pad electrode, and the signal line does not overlap the opening of the insulating layer in plan view.

10 Claims, 14 Drawing Sheets

(56)  References Cited

U.S. PATENT DOCUMENTS

2022/0005979  A1*  1/2022  Kang ................. H01L 25/0753
2022/0013693  A1*  1/2022  Cho ..................... H10H 20/01
2024/0222570  A1*  7/2024  Niu ..................... H10D 30/67

* cited by examiner

CF: CF1, CF2, CF3
LD: LD1, LD2, LD3
PXL: PXL1, PXL2, PXL3
QD: QD1, QD2, QD3

ALE: ALE1, ALE2
ELT: ELT1, ELT2

PXL

DPL

PCL

INS1  EP1  ELT1  ELT2  EP2  ELT2
ELT1  GI  INS2

VIA
PSV
ILD
BFL
SUB

TE1 GE SCP BML TE2  BNP  ALE1 LD ALE2  BNP  PL2b GI PL2a PL2c
T

Z
Y  X

ALE: ALE1, ALE2
ELT: ELT1, ELT2

NDA

A2  A1

CNT  CNT  OP  PE(PD1)

VIA
PSV
SL2
ILD
BFL
SL1

INS1
SUB

Z
Y  X

FIG. 10
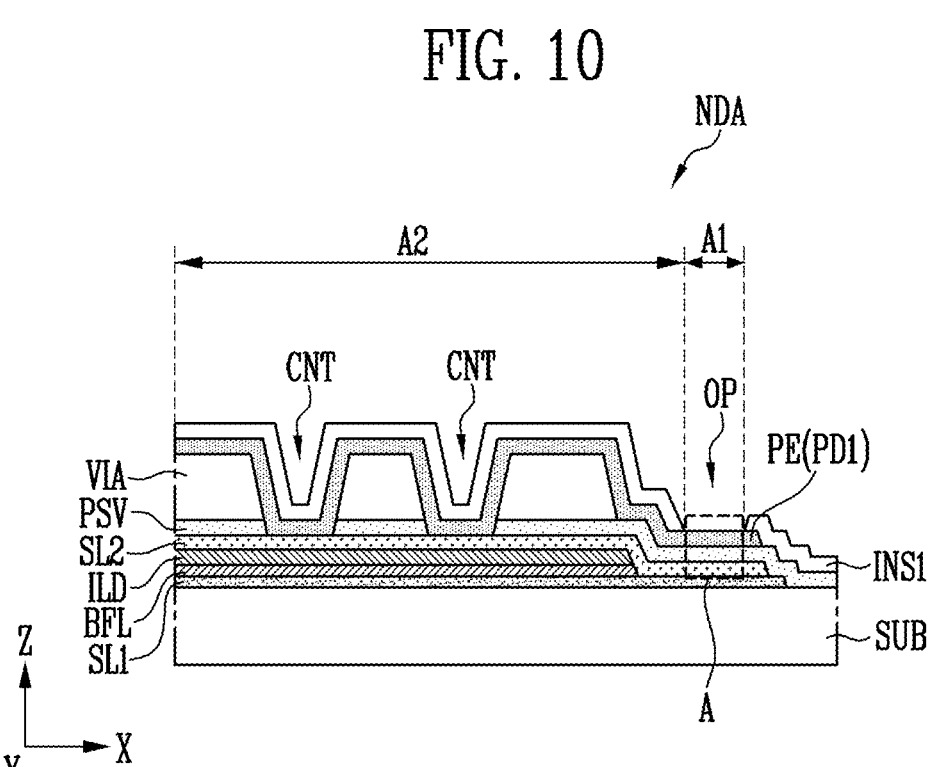
FIG. 11
FIG. 12
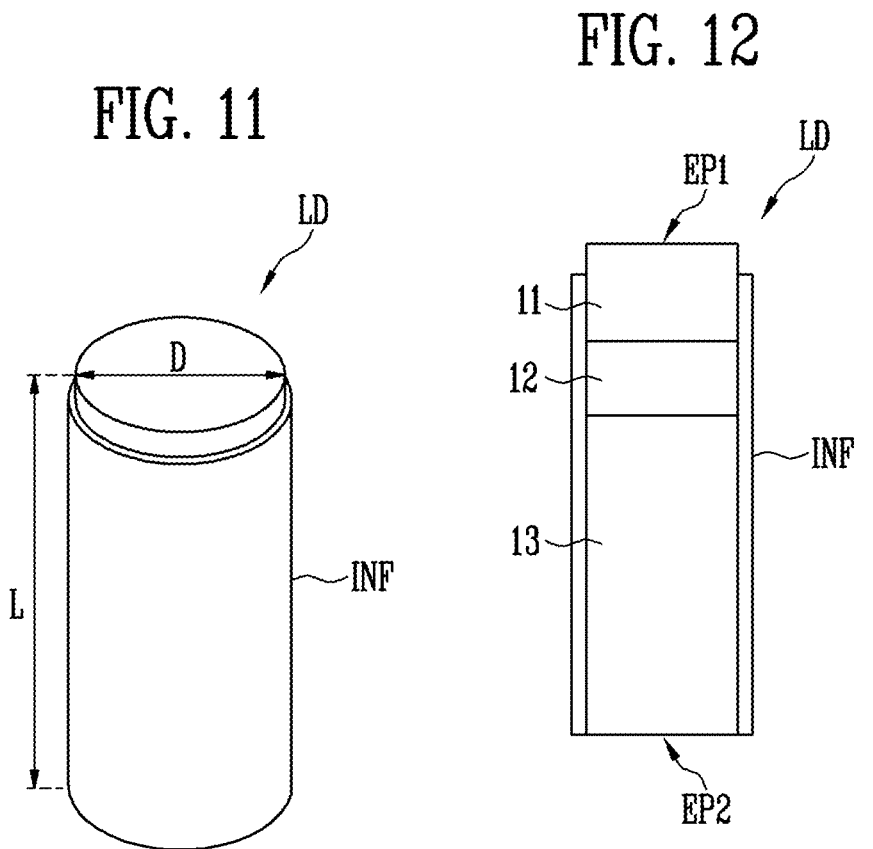

PXL

ALE1     ALE2

GI

—VIA
—PSV
—ILD
—BFL
—SUB

TE1 GE SCP BML TE2     BNP     BNP     PL2b GI PL2a PL2c

T

Z
↑
└→ X
Y

ALE: ALE1, ALE2

NDA

CNT     CNT

VIA
PSV
SL2
ILD
BFL
SL1

PE(PD1)

—SUB

Z
↑
└→ X
Y

ALE: ALE1, ALE2

ALE: ALE1, ALE2

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0117376 under 35 U.S.C. § 119, filed on Sep. 16, 2022 in the Korean Intellectual Property Office, the entire contents of which are incorporated herein by reference.

BACKGROUND

1. Technical Field

The disclosure relates to a display device and a method of manufacturing the same.

2. Description of the Related Art

In recent years, as interest in information display is increasing, research and development on display devices are continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device capable of minimizing damage to a pad and a method of manufacturing the same.

Objects of the disclosure are not limited to the above-objects, and other technical objects not mentioned will be clearly understood by those skilled in the art from the following description.

A display device according to embodiments may include electrodes spaced apart from each other in a display area; an insulating layer disposed on the electrodes; light emitting elements disposed between the electrodes on the insulating layer; a signal line electrically connected to the light emitting elements; and a pad electrode electrically connected to the signal line, the pad electrode and the electrodes being disposed on a same layer in a non-display area. The insulating layer may include an opening exposing the pad electrode, and the signal line may not overlap the opening of the insulating layer in plan view.

The display device may further include a via layer disposed between the signal line and the pad electrode.

The via layer may include a contact hole exposing the signal line.

The pad electrode may be electrically connected to the signal line through the contact hole of the via layer.

The insulating layer may cover the contact hole of the via layer.

The via layer may not overlap the opening of the insulating layer in plan view.

The display device may further include a circuit board electrically connected to the pad electrode.

The circuit board may include a circuit pad electrically connected to the pad electrode through the opening of the insulating layer.

The display device may further include connection electrodes electrically connected to the light emitting elements.

The connection electrodes may be electrically connected to the electrodes.

A method of manufacturing a display device according to embodiments may include forming a via layer on a signal line; forming a contact hole exposing the signal line in the via layer; forming electrodes and a pad electrode on the via layer; forming an insulating layer on the electrodes and the pad electrode; forming an opening in the insulating layer that exposes a first region of the pad electrode and does not overlap the contact hole in plan view; and aligning light emitting elements between the electrodes on the insulating layer. A second region of the pad electrode may be electrically connected to the signal line through the contact hole of the via layer.

The signal line may not overlap the first region of the pad electrode in plan view.

The method of the display device may further include forming a passivation layer between the signal line and the pad electrode.

The method of the display device may further include forming a contact hole exposing the signal line in the passivation layer.

The second region of the pad electrode may be electrically connected to the signal line through the contact hole of the passivation layer.

The method of the display device may further include connecting a circuit board to the pad electrode.

The method of the display device may further include providing conductive particles to the opening of the insulating layer.

The conductive particles may electrically connect the pad electrode and the circuit board.

In the connecting of the circuit board to the pad electrode, a hole may be formed in the passivation layer by the conductive particles.

The first region of the pad electrode may be electrically connected to the signal line through the hole of the passivation layer.

Details of other embodiments are included in the detailed description and drawings.

BRIEF DESCRIPTION OF THE DRAWINGS

The accompanying drawings, which are included to provide a further understanding of the disclosure, and are incorporated in and constitute a part of this specification, illustrate embodiments, and, together with the description, serve to explain principles of the disclosure in which:

FIG. 10 is a schematic cross-sectional view schematically illustrating the first pad according to an embodiment.

FIG. 11 is a schematic perspective view schematically illustrating a light emitting element according to an embodiment.

FIG. 12 is a schematic cross-sectional view schematically illustrating the light emitting element according to an embodiment.

DETAILED DESCRIPTION OF THE EMBODIMENTS

Figure 1:
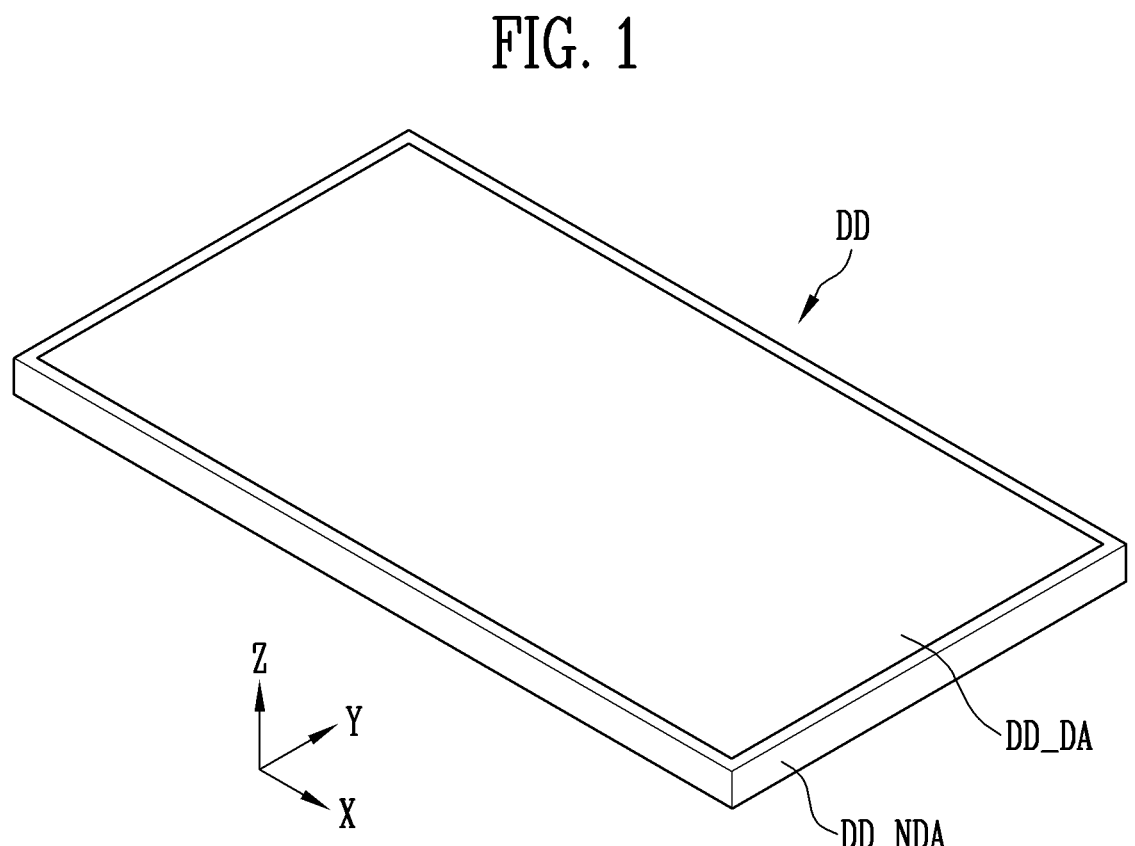
FIG. 1 is a schematic diagram schematically illustrating a display device according to an embodiment.

As the disclosure allows for various changes and numerous embodiments, embodiments will be illustrated in the drawings and described in detail in the written description. However, this is not intended to limit the disclosure to particular modes of practice, and it is to be appreciated that all changes, equivalents, and substitutes within the spirit and technical scope of the disclosure are encompassed in the disclosure.

In describing the drawings, like reference numerals have been used for like elements. In the accompanying drawings, dimensions of the structures are enlarged for clarity of the disclosure. For example, in the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. These terms are only used to distinguish one element from another element. For instance, a first element discussed below could be termed a second element without departing from the scope of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprise", "include", "have", etc. used in the disclosure, specify the presence of stated features, integers, steps, operations, elements, components, or combinations of them but do not preclude the presence or addition of one or more other features, integers, steps, operations, elements, components, or combinations thereof.

In addition, when a first part such as a layer, film, region, plate, etc. is "on" a second part, the first part may be not only "directly on" the second part but a third part may intervene between them. Furthermore, in the disclosure, when a first part such as a layer, film, region, plate, etc. is formed on a second part, a direction in which the first part is formed is not limited to an upper direction of the second part, but may include a side or lower direction of the second part. To the contrary, when a first part such as a layer, film, region, plate, etc. is "under" a second part, the first part may be not only "directly under" the second part but a third part may intervene between them.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, embodiments and other matters necessary for those skilled in the art to readily understand the contents of the disclosure will be described in detail with reference to the accompanying drawings.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
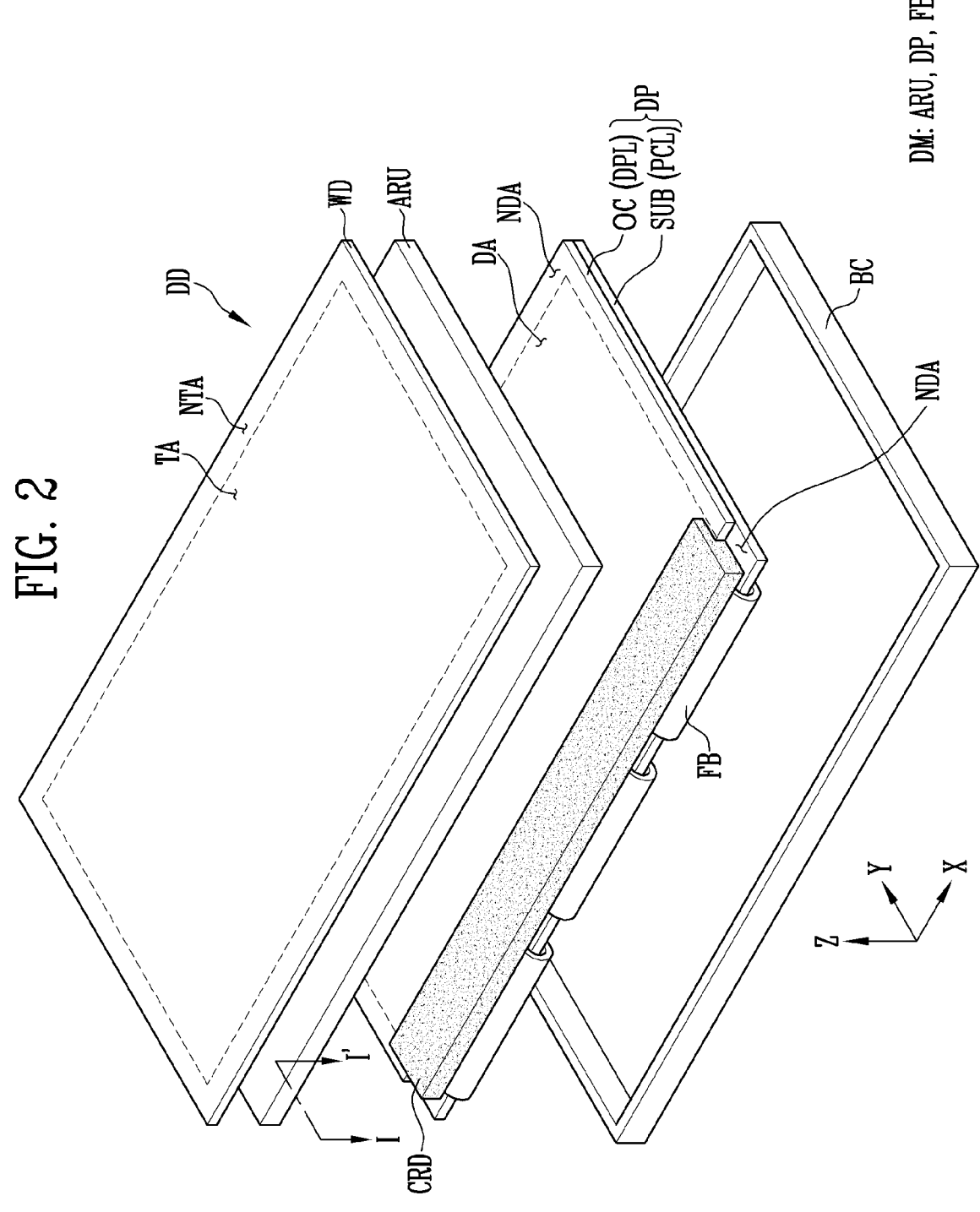
FIG. 2 is an exploded perspective view schematically illustrating the display device according to an embodiment.
Figure 3:
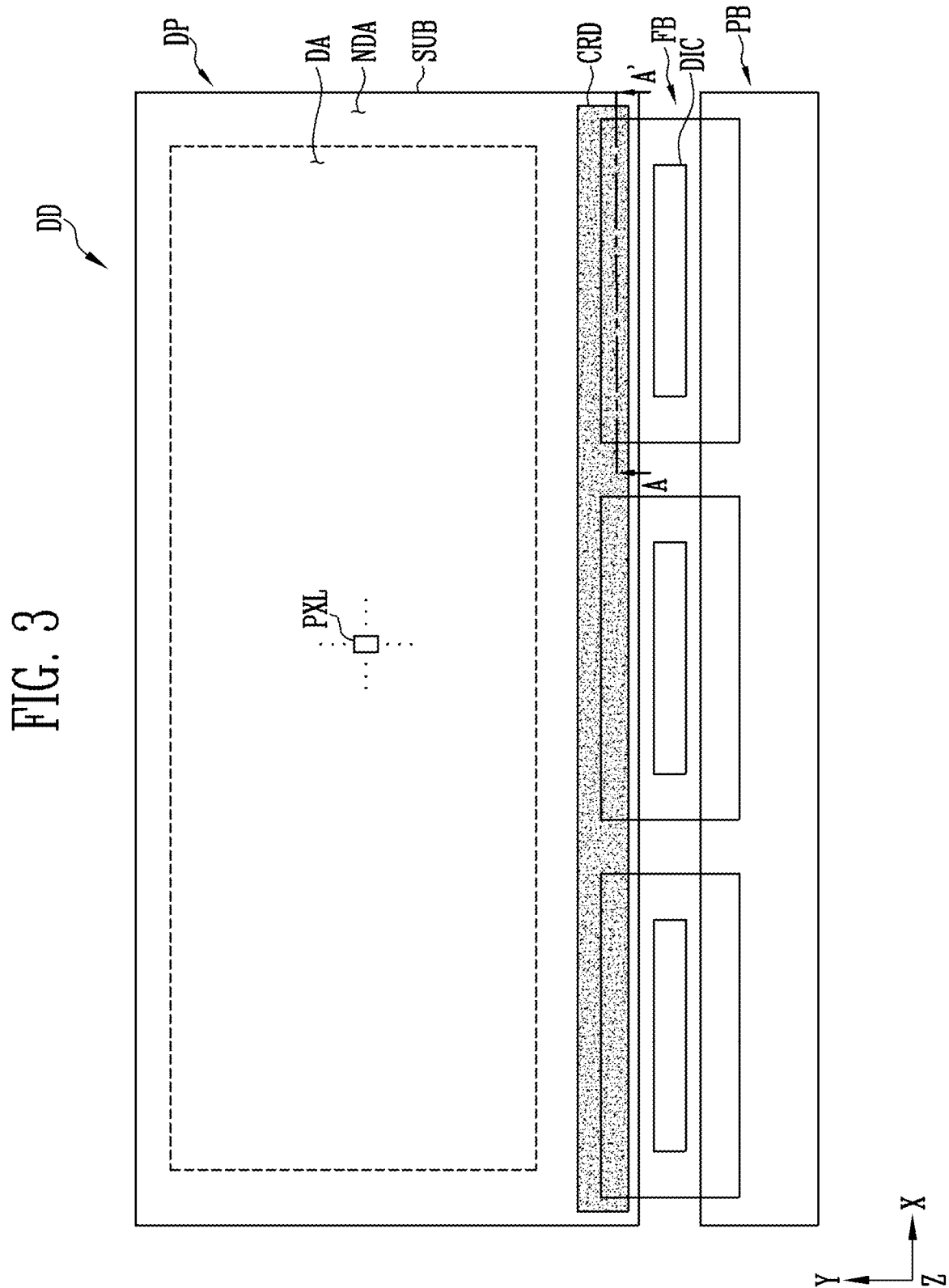
FIG. 3 is a schematic plan view schematically illustrating the display device according to an embodiment.
Figure 4:
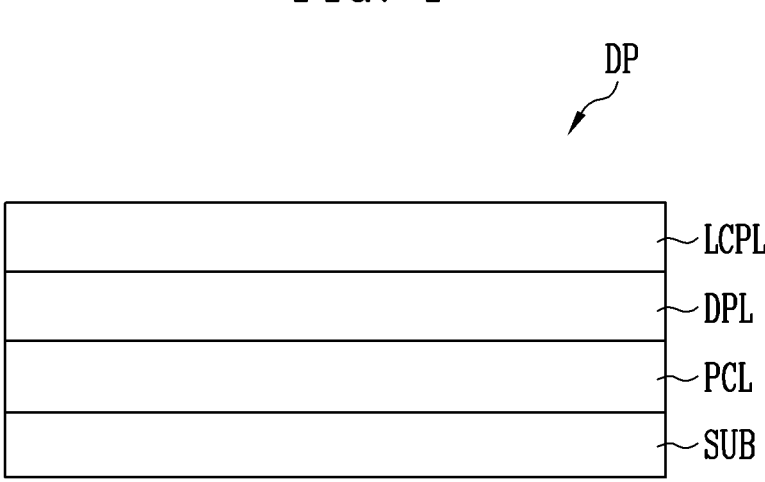
FIG. 4 is a schematic cross-sectional view schematically illustrating a display panel according to an embodiment.
Figure 5:
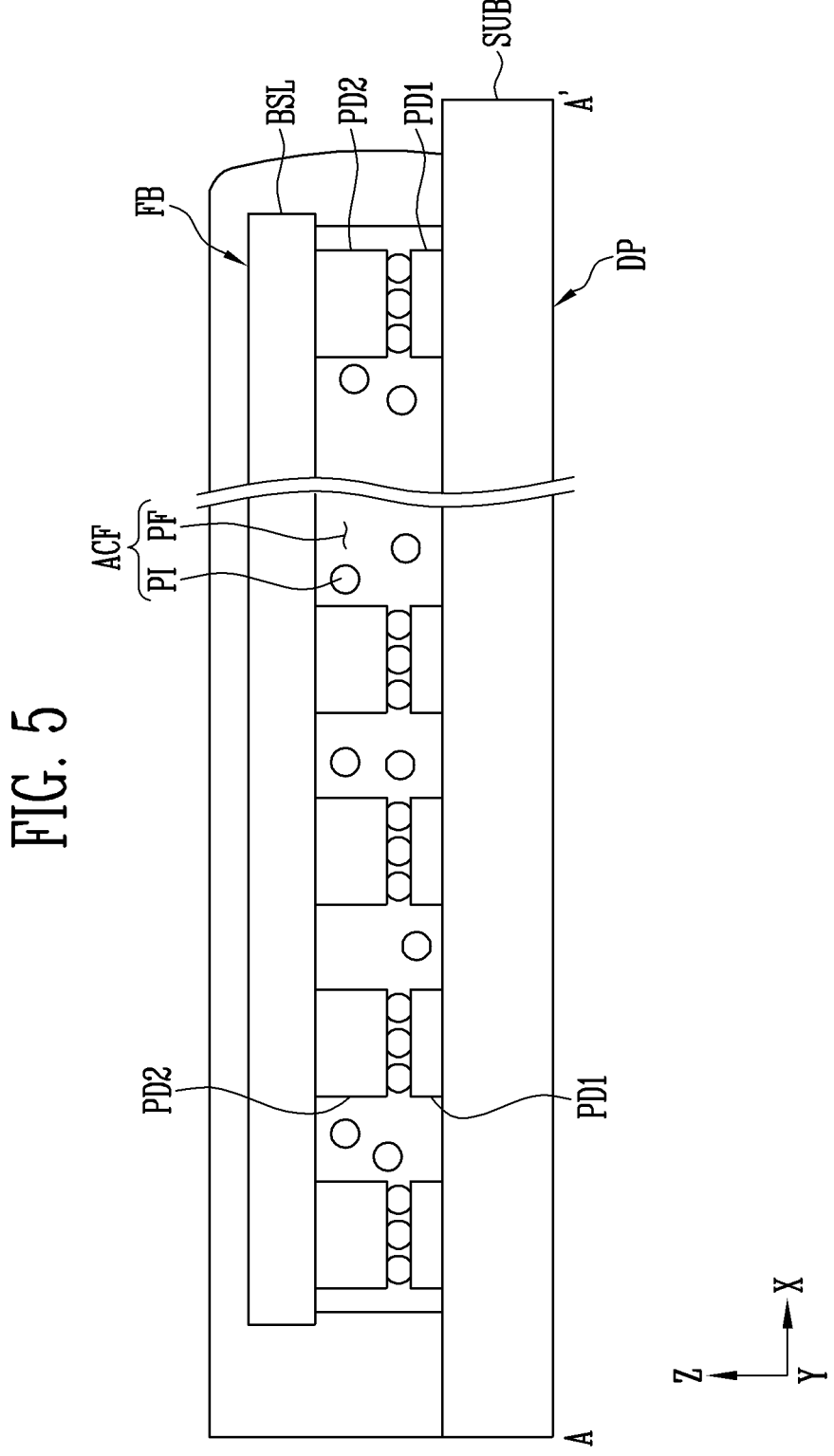
FIG. 5 is a schematic cross-sectional view taken along line A-A' of FIG. 3.

FIG. 1 is a schematic diagram schematically illustrating a display device according to an embodiment. FIG. 2 is an exploded perspective view schematically illustrating the display device according to an embodiment. FIG. 3 is a schematic plan view schematically illustrating the display device according to an embodiment. FIG. 4 is a schematic cross-sectional view schematically illustrating a display panel according to an embodiment. FIG. 5 is a schematic cross-sectional view taken along line A-A' of FIG. 3.

Referring to FIGS. 1 to 5, a display device DD may display an image through a display surface, for example, a display area DD_DA.

In case that the display device DD is an electronic device having a display surface applied to at least one surface or a surface, such as a smartphone, a television, a tablet PC, a mobile phone, a video phone, an e-book reader, a desktop PC, a laptop PC, a netbook computer, a workstation, a server, a PDA, a PMP (portable multimedia player), an MP3 player, a medical device, a camera, or a wearable device, the disclosure may be applied.

The display device DD may be provided in various shapes. For example, the display device DD may be provided in a rectangular plate shape having two pairs of sides parallel to each other. However, the disclosure is not limited thereto. In case that the display device DD is provided in a rectangular plate shape, one pair of sides among the two pairs of sides may be provided longer than the other pair of sides. In the drawings, the display device DD is shown as having an angled corner made of a straight line, but the disclosure is not limited thereto. According to an embodiment, the display device DD provided in a rectangular plate shape may have a shape in which a corner portion in which one long side or a long side and one short side or a short side are in contact with each other is rounded.

In an embodiment, for convenience of description, a case in which the display device DD has a rectangular shape having a pair of long sides and a pair of short sides will be described. An extension direction of the long sides may be defined as a first direction (X-axis direction), an extension direction of the short sides may be defined as a second direction (Y-axis direction), and a thickness direction of the display device DD (or substrate SUB) may be defined as a third direction (Z-axis direction).

In an embodiment, the display device DD may have flexibility in at least a portion, and may be folded at the flexible portion.

The display device DD may include the display area DD_DA displaying an image and a non-display area DD_NDA provided or disposed on at least one side or a side of the display area DD_DA. The non-display area DD_NDA may be an area in which an image is not displayed. However, the disclosure is not limited thereto. According to an embodiment, the shape of the display area DD_DA and the shape of the non-display area DD_NDA may be relatively designed.

According to an embodiment, the display device DD may include a sensing area and a non-sensing area. The display device DD may not only display an image through the sensing area, but may also sense a touch input made on the display surface (or input surface) or sense light incident from the front. The non-sensing area may surround the sensing area, but this is only an example and the disclosure is not limited thereto. According to an embodiment, a portion of the display area DD_DA may correspond to the sensing area.

The display device DD may include a window WD and a display module DM.

The window WD may be disposed on the display module DM to protect the display module DM from external impact and may transmit an image provided from the display module DM through a transmissive area TA. The window WD may include the transmissive area TA and a non-transmissive area NTA.

The transmissive area TA may have a shape corresponding to the display area DD_DA of the display device DD. For example, the image displayed on the display area DD_DA of the display device DD may be visually recognized from the outside through the transmissive area TA of the window WD.

The non-transmissive area NTA may have a shape corresponding to the non-display area DD_NDA of the display device DD. The non-transmissive area NTA may be an area having relatively low light transmittance compared to the transmissive area TA. However, the disclosure is not limited thereto, and the non-transmissive area NTA may be omitted.

The window WD may have a multilayer structure selected from a glass substrate, a plastic film, and a plastic substrate. The multilayer structure may be formed through a continuous process or an adhesion process using an adhesive layer. The window WD may be flexible in whole or in part.

The display module DM may be disposed between the window WD and an accommodation member BC. The display module DM may include a display panel DP, a circuit board FB, and an optical layer ARU (or an optical film).

The display panel DP may display an image. As the display panel DP, a self-light emitting display panel, such as an organic light emitting display panel (OLED panel) using an organic light emitting diode as a light emitting element, a micro-LED or nano-LED display panel using a micro light emitting diode as a light emitting element, a quantum dot organic light emitting display panel (QD OLED panel) using quantum dots and an organic light emitting diode, and the like, may be used. As the display panel DP, a non-light emitting display panel, such as a liquid crystal display panel (LCD panel), an electro-phoretic display panel (EPD panel), an electro-wetting display panel (EWD panel), and the like, may be used. In case that a non-light emitting display panel is used as the display panel DP, the display device DD may include a backlight unit for supplying light to the display panel DP.

The display panel DP may include a substrate SUB and pixels PXL provided on the substrate SUB.

The substrate SUB may constitute one area or an area having an approximately rectangular shape. However, the number of areas provided on the substrate SUB may be different from the above-described example, and the shape of the substrate SUB may vary depending on an area provided on the substrate SUB.

The substrate SUB may include a display area DA and a non-display area NDA. The display area DA may be an area in which the pixels PXL are provided to display an image, and the non-display area NDA may be an area in which the pixels PXL are not provided and an image is not displayed. For convenience of description, only one pixel PXL is shown in FIG. 3, but substantially pixels PXL may be provided in the display area DA of the substrate SUB.

The display area DA of the substrate SUB (or the display panel DP) may correspond to the display area DD_DA of the display device DD, and the non-display area NDA of the substrate SUB (or the display panel DP) may correspond to the non-display area DD_NDA of the display device DD. The non-display area NDA may correspond to a bezel area of the display device DD.

The non-display area NDA may be provided on at least one side or a side of the display area DA. The non-display area NDA may surround a perimeter (or an edge) of the display area DA. A wiring unit connected to the pixels PXL and a driver connected to the wiring unit and driving the pixels PXL may be provided in the non-display area NDA.

The wiring unit may electrically connect the driver and the pixels PXL. The wiring unit may be fan-out lines connected to a scan line, a data line, and the like connected to each pixel PXL to provide a signal to each pixel PXL.

First pads PD1 may be positioned on one surface or a surface of the substrate SUB. The first pads PD1 may be disposed in the non-display area NDA.

The pixels PXL may be provided in the display area DA of the substrate SUB. Each of the pixels PXL may be a minimum unit for displaying an image. The pixels PXL may include a light emitting element emitting white light and/or color light. Each of the pixels PXL may emit light of any one color of red, green, and blue, but the disclosure is not limited thereto. Each of the pixels PXL may emit light of a color such as cyan, magenta, or yellow.

The pixels PXL may be arranged or disposed in a matrix form along rows extending in the first direction (X-axis direction) and columns extending in the second direction (Y-axis direction) intersecting the first direction (X-axis direction). However, the arrangement form of the pixels PXL is not particularly limited and may be arranged in various forms. Although the pixels PXL having a rectangular shape are shown in the drawings, the disclosure is not limited thereto. The shape of the pixels PXL may be variously modified. In case that pixels PXL are provided, the pixels PXL may be provided to have different areas (or sizes). For example, in a case of the pixels PXL emitting light of different colors, the area (or size) or shape of the pixels PXL may be provided differently for each color.

The driver may control driving of the pixel PXL by providing a signal and power source to each pixel PXL through the wiring unit.

As shown in FIG. 4, the display panel DP may include the substrate SUB, a pixel circuit layer PCL, a display element layer DPL, and a light conversion pattern layer LCPL.

The pixel circuit layer PCL may be provided on the substrate SUB and may include transistors and signal lines connected to the transistors. For example, each transistor may have a form in which a semiconductor pattern, a gate electrode, a first transistor electrode, and a second transistor electrode are sequentially stacked with an insulating layer interposed therebetween. The semiconductor pattern may include amorphous silicon, poly silicon, low temperature poly silicon, and an organic semiconductor. The gate electrode, the first transistor electrode, and the second transistor electrode may include one of aluminum (Al), copper (Cu), titanium (Ti), and molybdenum (Mo), but the disclosure is not limited thereto. The pixel circuit layer PCL may include one or more insulating layers.

The display element layer DPL may be disposed on the pixel circuit layer PCL. The display element layer DPL may include a light emitting element emitting light. The light emitting element may be, for example, an organic light emitting diode, but the disclosure is not limited thereto. According to an embodiment, the light emitting element may be an inorganic light emitting element including an inorganic light emitting material or a light emitting element that emits light by changing a wavelength of light emitted using quantum dots.

The light conversion pattern layer LCPL may be disposed on the display element layer DPL. The light conversion pattern layer LCPL may use quantum dots to change the wavelength (or color) of light emitted from the display element layer DPL, and may selectively transmit light of a specific or given wavelength (or specific or given color) using a color filter. The light conversion pattern layer LCPL may be formed on a base surface provided by the display element layer DPL through a continuous process.

As will be described later with reference to FIG. 6, an overcoat layer OC may constitute an uppermost layer of the display panel DP. The overcoat layer OC may have a form of an encapsulation film formed of a multilayer film. The overcoat layer OC may include an inorganic layer and/or an organic layer. For example, the overcoat layer OC may have a form in which an inorganic layer, an organic layer, and an inorganic layer may be sequentially stacked each other. The overcoat layer OC may prevent external air and moisture from penetrating into the display element layer DPL and the pixel circuit layer PCL.

The circuit board FB may be coupled or connected to one end or an end (or one side or a side) of the display panel DP to provide a driving signal and a voltage to the display panel DP. For example, the driving signal may be a signal for displaying an image on the display panel DP, and the voltage may be a driving voltage required to drive the display panel DP. A flexible printed circuit board (FPCB) may be provided as the circuit board FB. As shown in FIG. 2, the circuit board FB may be folded along one side or a side of the display panel DP and positioned on a rear surface of the display panel DP.

The circuit board FB may process various signals input from a printed circuit board PB and output them to the display panel DP. To this end, the circuit board FB may be attached to the display panel DP and the printed circuit board PB, respectively. For example, one end or an end (or one side or a side) of the circuit board FB may be bonded to the display panel DP by a conductive adhesive member ACF, and the other end (or the other side) of the circuit board FB facing the one end or end may be bonded to the printed circuit board PB by the other conductive adhesive member (not shown). The conductive adhesive member ACF and the other conductive adhesive member may include an anisotropic conductive film.

The conductive adhesive member ACF may include conductive particles PI formed in an adhesive film PF having adhesive properties. The conductive particles PI may electrically connect first pads PD1 of the display panel DP and second pads PD2 of the circuit board FB. Accordingly, signals transferred to the second pads PD2 through a driver DIC mounted on the circuit board FB or a voltage of a driving power source may be transferred to the first pads PD1 of the display panel DP through the conductive adhesive member ACF.

The first pads PD1 may be provided in a pad area located or disposed in the non-display area NDA of the substrate SUB. The second pads PD2 may be provided on a base layer BSL of the circuit board FB.

The driver DIC may be positioned on the circuit board FB. The driver DIC may be an integrated circuit (IC). The driver DIC may receive driving signals output from the printed circuit board PB, and may output a signal and a driving voltage (or driving power source) to be provided to the pixels PXL based on the received driving signals. The above-described signals and driving voltage may be transferred to the first pads PD1 of the display panel DP through the second pads PD2 of the circuit board FB.

Although an embodiment in which the driver DIC is disposed on the circuit board FB has been described as an example, the disclosure is not limited thereto. According to an embodiment, the driver DIC may be disposed (or mounted) on the substrate SUB of the display panel DP.

The printed circuit board PB may generate all driving signals and power source signals necessary for driving the display panel DP and provide them to the display panel DP. The printed circuit board PB may include pads (not shown). The pads may be electrically connected to the pads of the circuit board FB. As a result, the driving signals and the power source signals may be transferred from the printed circuit board PB to the driver DIC through the circuit board FB.

The printed circuit board PB may be in various forms. For example, the printed circuit board PB may have a structure in which at least one layer or a layer of copper thin film is laminated on one or both sides of a base substrate made of an epoxy resin or the like within the spirit and the scope of the disclosure. The printed circuit board PB may have a structure in which at least one layer or a layer of copper thin film is laminated on one or both sides of a plastic film having flexibility. The printed circuit board PB may be formed in a multilayer structure in which a copper thin film is formed inside a base substrate.

The optical layer ARU may be disposed on the display panel DP and the circuit board FB. The optical layer ARU may reduce reflection of external light. The optical layer ARU may be an anti-reflection layer including a polarizing film and/or a retardation film. The number of retardation films and a retardation length ($\lambda/4$ or $\lambda/2$) of the retardation films may be determined according to an operation principle of the optical layer ARU.

The accommodation member BC may be coupled or connected to the window WD. The accommodation member BC may be provided on a rear surface of the display device DD and may be coupled or connected with the window WD to define an internal space. The accommodation member BC may include a material having a relatively high rigidity. The accommodation member BC may include a conductive material. For example, the accommodation member BC may include frames and/or plates made of a conductive material such as aluminum.

The accommodation member BC may stably protect components of the display device DD accommodated in the internal space from external impact. Although an embodiment in which the accommodation member BC may include a material having high rigidity has been described, the disclosure is not limited thereto. The accommodation member BC may include a flexible material. Although not shown in the drawings, the display device DD according to an embodiment may have a characteristic that it can be folded or bent. The components included in the display device DD may also have flexible properties.

In an embodiment, the display device DD (or the display module DM) may further include an upper protective layer CRD (or a protective layer, a protective unit) that at least partially covers the circuit board FB and the display panel DP.

The upper protective layer CRD may cover one side or a side of each of the circuit board FB and the display panel DP to prevent corrosion of pads of the circuit board FB and the display panel DP. The upper protective layer CRD may cover one side or a side of each of the circuit board FB and the display panel DP to block external moisture or the like from flowing into the pixels PXL. The upper protective layer CRD may more firmly couple or connect the circuit board FB and the display panel DP that are bonded to each other.

In an embodiment, the upper protective layer CRD may be formed of a resin. For example, the upper protective layer CRD may be formed of a thermosetting resin including a thermal polymerization initiator that initiates a curing reaction by heat. According to an embodiment, the upper protective layer CRD may be formed of a photocurable resin including a photopolymerization initiator that is crosslinked and cured by light such as ultraviolet rays or infrared rays. According to an embodiment, the upper protective layer CRD may include a light blocking material. It is possible to prevent the circuit board FB positioned under or below the upper protective layer CRD from being visually recognized. In an embodiment, the upper protective layer CRD may partially overlap the overcoat layer OC of the display panel DP in the third direction (Z-axis direction).

Figure 6:
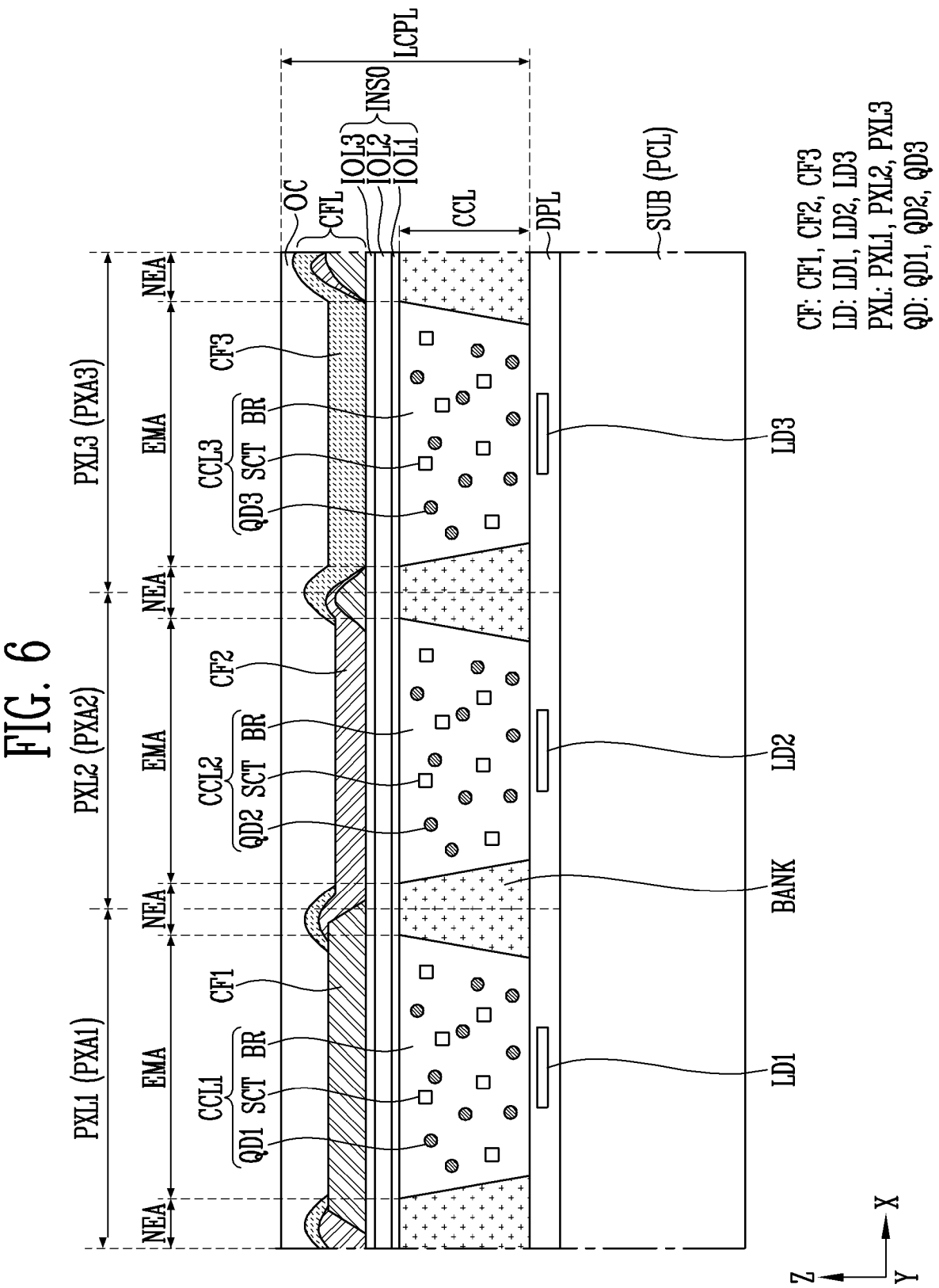
FIG. 6 is a schematic cross-sectional view schematically illustrating the display panel according to an embodiment.

FIG. 6 is a schematic cross-sectional view schematically illustrating the display panel according to an embodiment. FIG. 6 schematically shows the display panel DP based on the display area DA.

Referring to FIG. 6, a first pixel PXL1, a second pixel PXL2, and a third pixel PXL3 may be disposed on the substrate SUB. The first to third pixels PXL1, PXL2, and PXL3 may constitute one unit pixel, but the disclosure is not limited thereto.

According to an embodiment, the first to third pixels PXL1, PXL2, and PXL3 may emit light of different colors. For example, the first pixel PXL1 may be a red pixel emitting red light, the second pixel PXL2 may be a green pixel emitting green light, and the third pixel PXL3 may be a blue pixel emitting blue light. However, the color, type, and/or number of pixels constituting the unit pixel is not particularly limited. For example, the color of light emitted by each of the pixels may be variously changed. According to an embodiment, the first to third pixels PXL1, PXL2, and PXL3 may emit light of the same color. For example, each of the first to third pixels PXL1, PXL2, and PXL3 may be a blue pixel emitting blue light.

In embodiments, unless otherwise specified, the expression "formed and/or provided on the same layer" may mean formed in the same process, and the expression "formed and/or provided on different layers" may mean formed in different processes.

The pixel circuit layer PCL and the display element layer DPL may be disposed on the substrate SUB. For convenience of description, the pixel circuit layer PCL is shown together with the substrate SUB, but as described with reference to FIG. 4, the pixel circuit layer PCL may be disposed between the substrate SUB and the display element layer DPL.

The display element layer DPL may include light emitting elements LD provided in each emission area EMA. For example, a first light emitting element LD1 may be provided in a first pixel area PXA1, a second light emitting element LD2 may be provided in a second pixel area PXA2, and a third light emitting element LD3 may be provided in a third pixel area PXA3.

The light emitting element LD may be composed of an inorganic light emitting diode such as an organic light emitting diode or a quantum dot light emitting diode. In an embodiment, the light emitting element LD may be an ultra-small light emitting diode manufactured using a material having an inorganic crystal structure, for example, in a nano-scale to a micro-scale size. The light emitting element LD may be connected in parallel and/or in series with the light emitting element LD disposed adjacent to each other in each pixel PXL, but the disclosure is not limited thereto. The light emitting element LD may constitute a light source of each pixel PXL. Each pixel PXL may include at least one light emitting element LD driven by a signal (for example, a scan signal and a data signal) and/or a power source (for example, a first driving power source and a second driving power source). Detailed configurations of the pixel circuit layer PCL and the display element layer DPL will be described later with reference to FIGS. 7 and 8.

The light conversion pattern layer LCPL may include a color conversion layer CCL, an insulating layer INS0 (or a refractive index conversion layer), a color filter layer CFL (or a color filter CF), and an overcoat layer OC.

The color conversion layer CCL may include a bank BANK and first to third color conversion patterns CCL1, CCL2, and CCL3 (or first to third color conversion layers).

The bank BANK may be disposed on the display element layer DPL. The bank BANK may be located in a non-emission area NEA of the first to third pixels PXL1, PXL2, and PXL3. The bank BANK may be formed between the first to third pixels PXL1, PXL2, and PXL3 to surround each emission area EMA, so that the emission area EMA of each of the first to third pixels PXL1, PXL2, and PXL3 may be defined. The bank BANK may function as a dam structure that prevents a solution for forming the first to third color conversion patterns CCL1, CCL2, and CCL3 in the emission area EMA from flowing into the emission area EMA of an adjacent pixel, or that controls an amount of solution to be supplied to each emission area EMA.

An opening for exposing the display element layer DPL may be formed in the bank BANK to correspond to the emission area EMA. The first to third color conversion patterns CCL1, CCL2, and CCL3 may be disposed in the opening of each bank BANK.

The first to third color conversion patterns CCL1, CCL2, and CCL3 may include a base resin BR, color conversion particles QD, and light scattering particles SCT. The base resin BR may have high light transmittance and excellent dispersion properties for the color conversion particles QD. For example, the base resin BR may include an organic material such as an epoxy-based resin, an acrylic resin, a cardo-based resin, or an imide-based resin.

The color conversion particles QD may convert the color of light emitted from the light emitting element LD disposed in one pixel into a specific or given color. For example, in case that the first pixel PXL1 is a red pixel, the first color conversion layer CCL1 may include first color conversion particles QD1 as red quantum dots that convert light emitted from the first light emitting element LD1 into red light. In case that the second pixel PXL2 is a green pixel, the second color conversion layer CCL2 may include second color conversion particles QD2 as green quantum dots that convert light emitted from the second light emitting element LD2 into green light. In case that the third pixel PXL3 is a blue pixel, the third color conversion layer CCL3 may include third color conversion particles QD3 as blue quantum dots that convert light emitted from the third light emitting element LD3 into blue light. By way of example, in case that the third light emitting element LD3 emits blue light, the third color conversion layer CCL3 may not include the third color conversion particles QD3.

The light scattering particles SCT may have a refractive index different from that of the base resin BR and may form an optical interface with the base resin BR. The light scattering particles SCT may be metal oxide particles or organic particles. According to an embodiment, the light scattering particles SCT may be omitted.

The insulating layer INS0 may be disposed on the color conversion layer CCL. The insulating layer INS0 may be disposed on an entire surface of the substrate SUB to cover the color conversion layer CCL (for example, the bank BANK and the first to third color conversion patterns CCL1, CCL2, and CCL3).

The insulating layer INS0 may include at least three insulating layers, and may recycle light (for example, light traveling in an oblique direction) emitted from the color conversion layer CCL by using a difference in refractive index (or total reflection due to the difference in refractive index) between the three insulating layers. For example, the light totally reflected by the insulating layer INS0 may be re-reflected in the third direction (Z-axis direction) by the display element layer DPL (or an electrode included in the display element layer DPL and having a specific or given reflectance), or may be scattered in the third direction (Z-axis direction) by the color conversion layer CCL (for example, light scattering particles SCT). Accordingly, the efficiency (external quantum efficiency or light output efficiency) of light finally emitted from the pixel PXL through the insulating layer INS0 or the luminance of light emitted from the pixel PXL can be improved.

In an embodiment, the insulating layer INS0 may include a first inorganic layer IOL1 (or a first dense film), a second inorganic layer IOL2 (or a low refractive index film), and a third inorganic film IOL3 (or a second dense film) sequentially stacked each other on the color conversion layer CCL.

The first inorganic layer IOL1 may be disposed on the color conversion layer CCL, and may prevent moisture (or a solution used in a subsequent process) from penetrating into the color conversion layer CCL disposed thereunder. The second inorganic layer IOL2 may be disposed on the first inorganic layer IOL1, and may totally reflect light (for example, light traveling in an oblique direction) emitted from the color conversion layer CCL using a difference in refractive index with the first inorganic layer IOL1. The third inorganic layer IOL3 may be disposed on the second inorganic layer IOL2 and may improve adhesion between the second inorganic layer IOL2 and the color filter layer CFL disposed thereon.

The color filter layer CFL may be disposed on the insulating layer INS0. The color filter layer CFL may include a color filter material that selectively transmits light of a specific or given color converted by the color conversion layer CCL. The color filter layer CFL may include a red color filter, a green color filter, and a blue color filter. For example, in case that the first pixel PXL1 is a red pixel, a first color filter CF1 that transmits red light may be disposed on the first pixel PXL1. In case that the second pixel PXL2 is a green pixel, a second color filter CF2 that transmits green light may be disposed on the second pixel PXL2. In case that the third pixel PXL3 is a blue pixel, a third color filter CF3 that transmits blue light may be disposed on the third pixel PXL3.

The overcoat layer OC may be disposed on the color filter layer CFL. The overcoat layer OC may be disposed on the entire surface of the substrate SUB to cover lower components, and may encapsulate the display area DA of the display panel DP.

Figure 7:
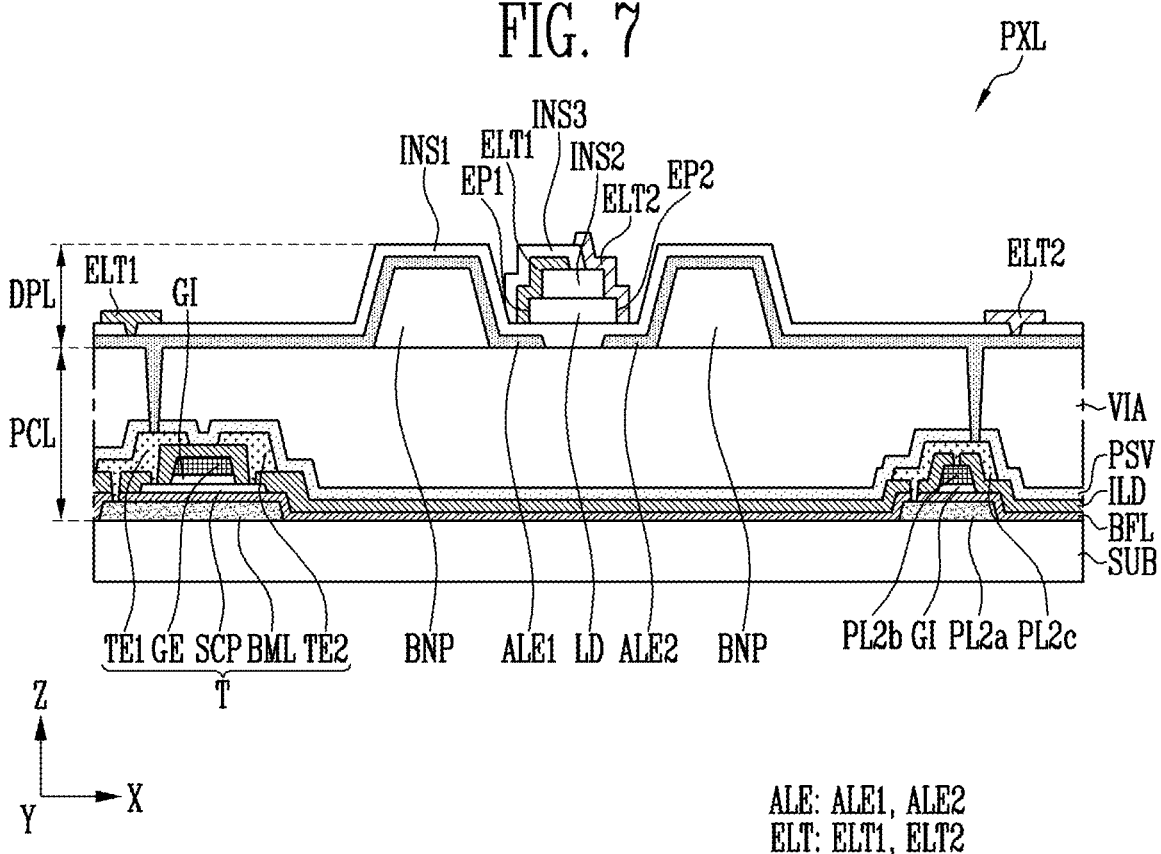
FIGS. 7 and 8 are schematic cross-sectional views schematically illustrating a pixel according to an embodiment.
Figure 8:
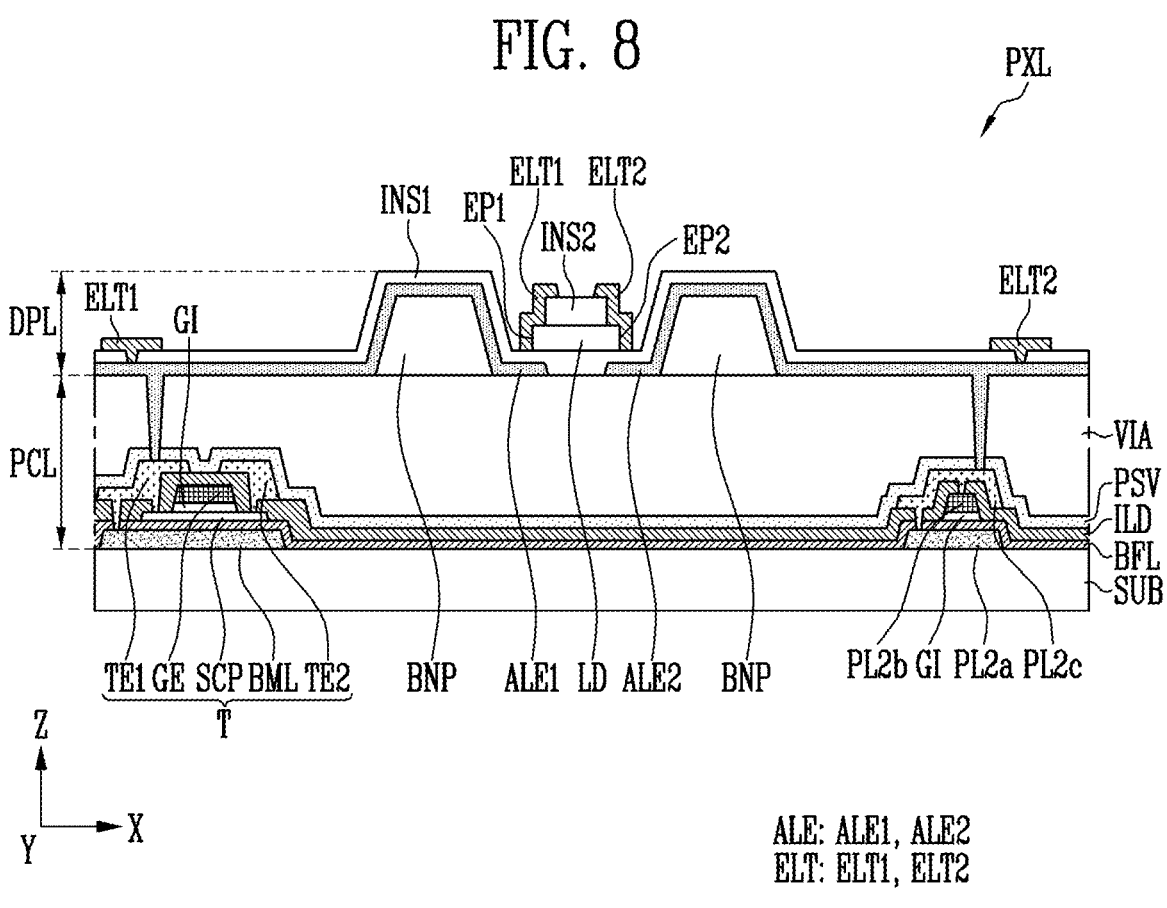

FIGS. 7 and 8 are schematic cross-sectional views schematically illustrating a pixel according to an embodiment. FIGS. 7 and 8 schematically show the pixel circuit layer PCL and the display element layer DPL of the pixel PXL. FIGS. 7 and 8 show only one pixel PXL for simplicity. For example, each electrode is shown as a single-layered electrode and each insulating layer is shown as a single-layered insulating layer. However, the disclosure is not limited thereto. In embodiments, the term "connection" between two components may mean to include both an electrical connection and a physical connection.

Referring to FIGS. 7 and 8, each pixel PXL may include the pixel circuit layer PCL and the display element layer DPL disposed on the substrate SUB.

The pixel circuit layer PCL may include a transistor T, a buffer layer BFL, an interlayer insulating layer ILD, a passivation layer PSV, and a via layer VIA.

The substrate SUB may constitute a base member and may be a rigid or flexible substrate or film. For example, the substrate SUB may be a rigid substrate made of glass or tempered glass, a flexible substrate (or thin film) made of plastic or metal, or at least one insulating layer. The material and/or physical properties of the substrate SUB are not particularly limited. In an embodiment, the substrate SUB may be substantially transparent. Here, the expression "substantially transparent" may mean that light can be transmitted with a transmittance or more. In an embodiment, the substrate SUB may be translucent or opaque. The substrate SUB may include a reflective material according to an embodiment.

A lower conductive layer BML and a first power source conductive layer PL2a may be disposed on the substrate SUB. The lower conductive layer BML and the first power source conductive layer PL2a may be disposed on the same layer. For example, the lower conductive layer BML and the first power source conductive layer PL2a may be simultaneously formed in the same process, but the disclosure is not necessarily limited thereto.

Each of the lower conductive layer BML and the first power source conductive layer PL2a may be composed of a single layer or multiple layers formed of molybdenum (Mo), copper (Cu), aluminum (Al), chromium (Cr), gold (Au), titanium (Ti), nickel (Ni), neodymium (Nd), indium (In), tin (Sn), and oxides or alloys thereof.

The buffer layer BFL may be disposed on the lower conductive layer BML and the first power source conductive layer PL2a. The buffer layer BFL may prevent impurities from diffusing into circuit elements. The buffer layer BFL may be composed of a single layer, but may be composed of at least a double layer or more. In case that the buffer layer BFL is composed of multiple layers, each layer may be formed of the same material or similar material or may be formed of different materials.

A semiconductor pattern SCP may be disposed on the buffer layer BFL. For example, the semiconductor pattern SCP may include a first region in contact with a first transistor electrode TE1, a second region in contact with a second transistor electrode TE2, and a channel region positioned between the first and second regions. According to an embodiment, one of the first and second regions may be a source region and the other may be a drain region.

According to an embodiment, the semiconductor pattern SCP may be formed of amorphous silicon, poly silicon, low temperature poly silicon, an organic semiconductor, or the like within the spirit and the scope of the disclosure. The channel region of the semiconductor pattern SCP may be an intrinsic semiconductor as a semiconductor pattern not doped with impurities, and each of the first and second regions of the semiconductor pattern SCP may be a semiconductor doped with an impurity.

A gate insulating layer GI may be disposed on the buffer layer BFL and the semiconductor pattern SCP. For example, the gate insulating layer GI may be disposed between the semiconductor pattern SCP and a gate electrode GE. The gate insulating layer GI may be disposed between the buffer layer BFL and a second power source conductive layer PL2b. The gate insulating layer GI may be composed of a single layer or multiple layers, and may include various kinds of inorganic materials such as silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), or titanium oxide (TiO$_x$).

The gate electrode GE of the transistor T and the second power source conductive layer PL2b may be disposed on the gate insulating layer GI. The gate electrode GE and the second power source conductive layer PL2b may be disposed on the same layer. For example, the gate electrode GE and the second power source conductive layer PL2b may be simultaneously formed in the same process, but the disclosure is not necessarily limited thereto. The gate electrode GE may be disposed on the gate insulating layer GI to overlap the semiconductor pattern SCP in the third direction (Z-axis direction). The second power source conductive layer PL2b may be disposed on the gate insulating layer GI to overlap the first power source conductive layer PL2a in the third direction (Z-axis direction).

Each of the gate electrode GE and the second power source conductive layer PL2b may be composed of a single layer or multiple layers formed of molybdenum (Mo), copper (Cu), aluminum (Al), chromium (Cr), gold (Au), titanium (Ti), nickel (Ni), neodymium (Nd), indium (In), tin (Sn), and oxides or alloys thereof. For example, each of the gate electrode GE and the second power source conductive layer PL2b may be formed of a multilayer in which titanium (Ti), copper (Cu), and/or indium tin oxide (ITO) may be sequentially or repeatedly stacked each other.

The interlayer insulating layer ILD may be disposed on the gate electrode GE and the second power source conductive layer PL2b. For example, the interlayer insulating layer ILD may be disposed between the gate electrode GE and the first and second transistor electrodes TE1 and TE2. The interlayer insulating layer ILD may be disposed between the second power source conductive layer PL2b and a third power source conductive layer PL2c.

The interlayer insulating layer ILD may be composed of a single layer or multiple layers, and may include various kinds of inorganic materials such as silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), or titanium oxide (TiO$_x$).

The first and second transistor electrodes TE1 and TE2 of the transistor T and the third power source conductive layer PL2c may be disposed on the interlayer insulating layer ILD. The first and second transistor electrodes TE1 and TE2 and the third power source conductive layer PL2c may be disposed on the same layer. For example, the first and second transistor electrodes TE1 and TE2 and the third power source conductive layer PL2c may be simultaneously formed in the same process, but the disclosure is not necessarily limited thereto.

The first and second transistor electrodes TE1 and TE2 may be disposed to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole penetrating the interlayer insulating layer ILD. The first transistor electrode TE1 may be electrically connected to the lower conductive layer BML through a contact hole penetrating the interlayer insulating layer ILD and the buffer layer BFL. The second transistor electrode TE2 may be electrically connected to the second region of the semiconductor pattern SCP through a contact hole penetrating the interlayer insulating layer ILD. According to an embodiment, one of the first and second transistor electrodes TE1 and TE2 may be a source electrode, and the other may be a drain electrode.

The third power source conductive layer PL2c may be disposed to overlap the first power source conductive layer PL2a and/or the second power source conductive layer PL2b in the third direction (Z-axis direction). The third power source conductive layer PL2c may be electrically connected to the first power source conductive layer PL2a and/or the second power source conductive layer PL2b. For example, the third power source conductive layer PL2c may be electrically connected to the first power source conductive layer PL2a through a contact hole penetrating the interlayer insulating layer ILD and the buffer layer BFL. The third power source conductive layer PL2c may be electrically connected to the second power source conductive layer PL2b through a contact hole penetrating the interlayer insulating layer ILD.

The first and second transistor electrodes TE1 and TE2 and the third power source conductive layer PL2c may be composed of a single layer or multiple layers formed of molybdenum (Mo), copper (Cu), aluminum (Al), chromium (Cr), gold (Au), titanium (Ti), nickel (Ni), neodymium (Nd), indium (In), tin (Sn), and oxides or alloys thereof.

The passivation layer PSV may be disposed on the first and second transistor electrodes TE1 and TE2 and the third power source conductive layer PL2c. The passivation layer PSV may be composed of a single layer or multiple layers, and may include various kinds of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The via layer VIA may be disposed on the passivation layer PSV. The via layer VIA may be formed of an organic material to planarize the step difference thereunder. For example, the via layer VIA may include an organic material such as an acrylates resin, an epoxy resin, a phenolic resin, a polyamides resin, a polyimides resin, a polyester resin, a polyphenylenesulfides resin, or benzocyclobutene (BCB). However, the disclosure is not necessarily limited thereto. The via layer VIA may include various kinds of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The display element layer DPL may be provided on the via layer VIA. The display element layer DPL may include bank patterns BNP, electrodes ALE, the light emitting element LD, connection electrodes ELT, and insulating layers INS1, INS2, and INS3.

The bank patterns BNP may be disposed on the via layer VIA. The bank patterns BNP may serve to form a step difference so that light emitting elements LD may be readily aligned in the emission area EMA (refer to FIG. 6).

The bank patterns BNP may have various shapes according to embodiments. In an embodiment, the bank patterns BNP may have a shape protruding from the substrate SUB in the third direction (Z-axis direction). The bank patterns BNP may be formed to have an inclined surface inclined at an angle with respect to the substrate SUB. However, the disclosure is not necessarily limited thereto, and the bank patterns BNP may have sidewalls such as a curved surface or a stepped shape. For example, the bank patterns BNP may have a cross-section such as a semi-circle or semi-ellipse shape.

The bank patterns BNP may include at least one organic material and/or inorganic material. For example, the bank patterns BNP may include an organic material such as an acrylates resin, an epoxy resin, a phenolic resin, a polyamides resin, a polyimides resin, a polyester resin, a polyphenylenesulfides resin, or benzocyclobutene (BCB). However, the disclosure is not necessarily limited thereto. The bank patterns BNP may include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The electrodes ALE may be disposed on the via layer VIA and the bank patterns BNP. The electrodes ALE may at least partially cover side surfaces and/or top surfaces of the bank patterns BNP. The electrodes ALE disposed on the bank patterns BNP may have shapes corresponding to the bank patterns BNP. For example, the electrodes ALE disposed on the bank patterns BNP may include an inclined surface or a curved surface having a shape corresponding to the shape of the bank patterns BNP. The bank patterns BNP and the electrodes ALE may be reflective members that reflect light emitted from the light emitting elements LD and guide the light toward the front direction of the pixel PXL, for example, in the third direction (Z-axis direction). Therefore, light output efficiency of the display panel DP can be improved.

The electrodes ALE may be disposed to be spaced apart from each other. The electrodes ALE may be disposed on the same layer. For example, the electrodes ALE may be simultaneously formed in the same process, but the disclosure is not necessarily limited thereto.

The electrodes ALE may receive an alignment signal in a step of aligning the light emitting elements LD. Accordingly, an electric field may be formed between the electrodes ALE, so that the light emitting elements LD provided to each pixel PXL may be aligned between the electrodes ALE.

The electrodes ALE may include at least one conductive material. For example, the electrodes ALE may include at least one of conductive materials such as at least one of various metal materials such as silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), or an alloy including the same, a conductive oxide such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer such as PEDOT material. However, the disclosure is not necessarily limited thereto.

The first electrode ALE1 may be electrically connected to the first transistor electrode TE1 of the transistor T through a contact hole penetrating the via layer VIA and the passivation layer PSV. The second electrode ALE2 may be electrically connected to the third power source conductive layer PL2c through a contact hole penetrating the via layer VIA and the passivation layer PSV.

A first insulating layer INS1 may be disposed on the electrodes ALE. The first insulating layer INS1 may be composed of a single layer or multiple layers, and may include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The light emitting elements LD may be disposed between the electrodes ALE. The light emitting elements LD may be aligned between the electrodes ALE on the first insulating layer INS1. The light emitting elements LD may be prepared in a dispersed form in a light emitting element ink, and may be supplied to each pixel PXL through an inkjet printing method or the like within the spirit and the scope of the disclosure. For example, the light emitting elements LD may be dispersed in a volatile solvent and provided to each pixel PXL. In case that the alignment signal is supplied to the electrodes ALE, the electric field may be formed between the electrodes ALE to align the light emitting elements LD between the electrodes ALE. If the solvent is evaporated or the solvent is removed in another way after the light emitting elements LD are aligned, the light emitting elements LD can be stably arranged between the electrodes ALE.

A second insulating layer INS2 may be disposed on the light emitting elements LD. For example, the second insulating layer INS2 may be partially provided on the light emitting elements LD and may expose first and second ends EP1 and EP2 of the light emitting elements LD. In case that the second insulating layer INS2 is formed on the light emitting elements LD after the light emitting elements LD are aligned, it is possible to prevent the light emitting elements LD from being separated from the aligned positions.

The second insulating layer INS2 may be composed of a single layer or multiple layers, and may include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The connection electrodes ELT may be disposed on the first and second ends EP1 and EP2 of the light emitting elements LD exposed by the second insulating layer INS2. A first connection electrode ELT1 may be disposed on or directly disposed on first ends EP1 of the light emitting elements LD to be connected to the first ends EP1 of the light emitting elements LD. The first connection electrode ELT1 may be electrically connected to the first electrode ALE1 through a contact hole penetrating the first insulating layer INS1.

A second connection electrode ELT2 may be disposed on or directly disposed on second ends EP2 of the light emitting elements LD to be contacted to the second ends EP2 of the light emitting elements LD. The second connection electrode ELT2 may be electrically connected to the second electrode ALE2 through a contact hole penetrating the first insulating layer INS1.

In an embodiment, the connection electrodes ELT may be composed of conductive layers. For example, as shown in FIG. 7, the first connection electrode ELT1 and the second connection electrode ELT2 may be disposed on different layers, and a third insulating layer INS3 may be disposed between the first connection electrode ELT1 and the second connection electrode ELT2. As described above, in case that the third insulating layer INS3 is disposed between the connection electrodes ELT formed of different conductive layers, the connection electrodes ELT may be stably separated by the third insulating layer INS3. Therefore, electrical stability between the first and second ends EP1 and EP2 of the light emitting elements LD can be secured.

The third insulating layer INS3 may be composed of a single layer or multiple layers, and may include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

In an embodiment, the connection electrodes ELT may be formed of the same conductive layer. For example, as shown in FIG. 8, the first connection electrode ELT1 and the second connection electrode ELT2 may be disposed on the same layer. For example, the first connection electrode ELT1 and the second connection electrode ELT2 may be simultaneously formed in the same process. In case that the connection electrodes ELT are simultaneously formed, the number of masks may be reduced and the manufacturing process may be simplified.

The connection electrodes ELT may be formed of various transparent conductive materials. For example, the connection electrodes ELT may include at least one of various transparent conductive materials such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be substantially transparent or translucent to satisfy a light transmittance. Accordingly, light emitted from the first and second ends EP1 and EP2 of the light emitting elements LD may pass through the connection electrodes ELT and be emitted to outside of the display panel DP.

Figure 9:
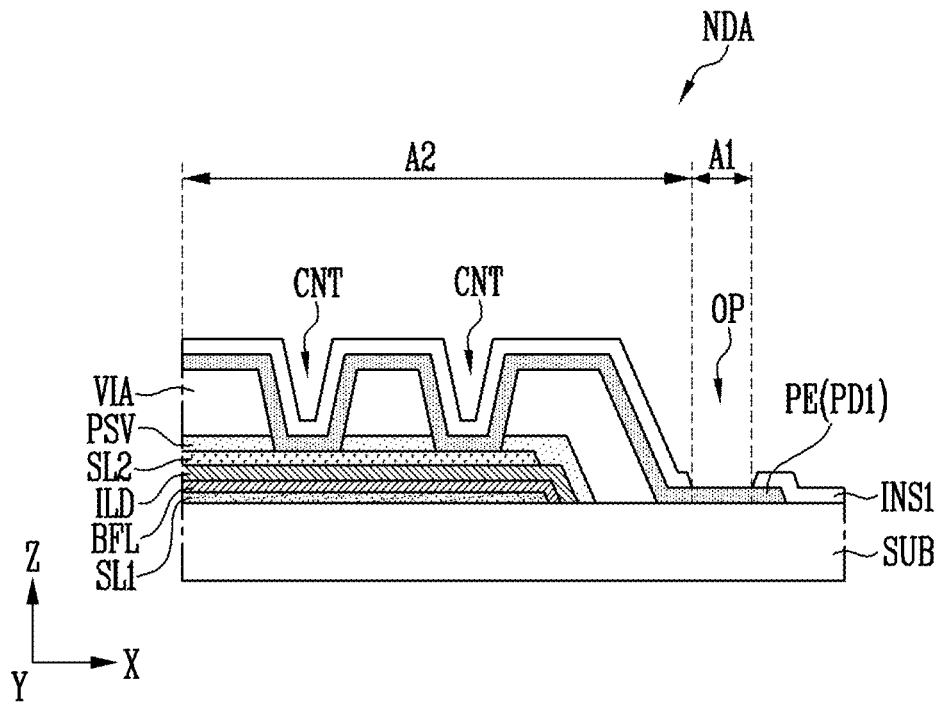
FIG. 9 is a schematic cross-sectional view schematically illustrating a first pad according to an embodiment.

FIG. 9 is a schematic cross-sectional view schematically illustrating a first pad according to an embodiment. Referring to FIG. 9, a first signal line SL1 may be disposed on the non-display area NDA of the substrate SUB. The first signal line SL1 may provide a signal to each pixel PXL (or the light emitting element LD). For example, the first signal line SL1 may be one of fan-out lines electrically connected to a scan line, a data line, and the like electrically connected to each pixel PXL (or the light emitting element LD).

The first signal line SL1 may be disposed on the same layer as the above-described lower conductive layer BML and/or the first power source conductive layer PL2a. For example, the first signal line SL1 may be simultaneously formed in the same process as the lower conductive layer BML and/or the first power source conductive layer PL2a, but the disclosure is not necessarily limited thereto. The buffer layer BFL and the interlayer insulating layer ILD may be disposed on the first signal line SL1.

A second signal line SL2 may be disposed on the interlayer insulating layer ILD. The second signal line SL2 may provide a signal to each pixel PXL (or the light emitting element LD). For example, the second signal line SL2 may be one of fan-out lines electrically connected to the scan line, the data line, and the like electrically connected to each pixel PXL (or the light emitting element LD).

The second signal line SL2 may be disposed on the same layer as the above-described first and second transistor electrodes TE1 and TE2 and/or the third power source conductive layer PL2c. For example, the second signal line SL2 may be simultaneously formed in the same process as the first and second transistor electrodes TE1 and TE2 and/or the third power source conductive layer PL2c, but the disclosure is not necessarily limited thereto. The passivation layer PSV and the via layer VIA may be disposed on the second signal line SL2.

A pad electrode PE may be disposed on the via layer VIA. The pad electrode PE may form the above-described first pads PD1. The pad electrode PE may be electrically connected to the second signal line SL2. The pad electrode PE may be connected to the second signal line SL2 through contact holes CNT penetrating the passivation layer PSV and the via layer VIA.

The pad electrode PE may be disposed on the same layer as the above-described electrodes ALE. For example, the pad electrode PE may be simultaneously formed in the same process as the electrodes ALE, but the disclosure is not necessarily limited thereto.

The first insulating layer INS1 may be disposed on the pad electrode PE. The first insulating layer INS1 may include an opening OP exposing a first region A1 of the pad electrode PE. The first region A1 of the pad electrode PE exposed by the opening OP of the first insulating layer INS1 may be electrically connected to the above-described circuit board FB (refer to FIG. 5) as the first pads PD1. For example, the second pads PD2 of the circuit board FB (refer to FIG. 5) may be electrically connected to the first region A1 of the pad electrode PE through the opening OP of the first insulating layer INS1.

The signal lines SL1 and SL2 may not overlap the opening OP of the first insulating layer INS1. For example, the second signal line SL2 may not overlap the first region A1 of the pad electrode PE exposed by the opening OP of the first insulating layer INS1. The second signal line SL2 may not contact the first region A1 of the pad electrode PE exposed by the opening OP of the first insulating layer INS1. According to an embodiment, the via layer VIA may not overlap the opening OP of the first insulating layer INS1.

The second signal line SL2 may be electrically connected to a second region A2 of the pad electrode PE covered by the first insulating layer INS1. The second region A2 of the pad electrode PE may be connected to the second signal line SL2 through the contact holes CNT of the passivation layer PSV and the via layer VIA. The contact holes CNT of the passivation layer PSV and the via layer VIA may be covered by the first insulating layer INS1. For example, the contact holes CNT of the passivation layer PSV and the via layer VIA may not overlap the opening OP of the first insulating layer INS1. As described above, in case that the contact holes CNT through which the pad electrode PE and the second signal line SL2 are connected to each other are protected by the first insulating layer INS1, it is possible to prevent the pad electrode PE from being peeled off from the second signal line SL2 by being exposed to a chemical solution in a subsequent process. Accordingly, damage to the pad electrode PE, for example, the first pads PD1 may be minimized.

FIG. 9 shows an embodiment in which the pad electrode PE is electrically connected to the second signal line SL2, but the disclosure is not necessarily limited thereto. The pad electrode PE may also be electrically connected to the first signal line SL1.

Hereinafter, an embodiment will be described. In the following embodiment, components that are the same as those already described are referred to by the same reference numerals, and duplicate descriptions may be omitted or simplified.

FIG. 10 is a schematic cross-sectional view schematically illustrating the first pad according to an embodiment.

Referring to FIG. 10, the signal lines SL1 and SL2 may overlap the first region A1 of the pad electrode PE. The passivation layer PSV may be disposed between the signal lines SL1 and SL2 and the first region A1 of the pad electrode PE. The signal lines SL1 and SL2 may be separated from the first region A1 of the pad electrode PE by the passivation layer PSV. In an embodiment, the display panel DP may be manufactured by performing a subsequent process in a state in which the signal lines SL1 and SL2 and the first region A1 of the pad electrode PE are separated by the passivation layer PSV. A hole may be formed in the passivation layer PSV disposed under or below the first region A1 of the pad electrode PE by pressure in a process of coupling or connecting the display panel DP and the circuit board FB. The first region A1 of the pad electrode PE may be electrically connected to the second signal line SL2 through the hole of the passivation layer PSV. As described above, in case that the second signal line SL2 is in contact with the first region A1 of the pad electrode PE in a step of coupling or connecting the circuit board FB after performing the subsequent process in a state in which the second signal line SL2 and the first region A1 of the pad electrode PE are separated, a contact portion between the first region A1 of the pad electrode PE and the second signal line SL2 may not be exposed to the chemical solution in a subsequent process. Therefore, it is possible to prevent the first region A1 of the pad electrode PE from being peeled off from the second signal line SL2. A detailed description thereof will be described later with reference to FIGS. 20 and 21.

FIG. 11 is a schematic perspective view schematically illustrating a light emitting element according to an embodiment. FIG. 12 is a schematic cross-sectional view schematically illustrating the light emitting element according to an embodiment. FIGS. 11 and 12 show the light emitting element LD having a columnar shape, the type and/or shape of the light emitting element LD applicable to the above-described display device DD is not limited thereto.

Referring to FIGS. 11 and 12, the light emitting element LD may include a first semiconductor layer 11, an active layer 12, and/or a second semiconductor layer 13.

The light emitting element LD may be formed in a columnar shape extending along one direction or a direction. The light emitting element LD may have the first end EP1 and the second end EP2. One of the first and second semiconductor layers 11 and 13 may be disposed at the first end EP1 of the light emitting element LD. The other one of the first and second semiconductor layers 11 and 13 may be disposed at the second end EP2 of the light emitting element LD. For example, the first semiconductor layer 11 may be disposed at the first end EP1 of the light emitting element LD, and the second semiconductor layer 13 may be disposed at the second end EP2 of the light emitting element LD.

According to an embodiment, the light emitting element LD may be a light emitting element manufactured in a columnar shape through an etching method or the like within the spirit and the scope of the disclosure. In this specification, the columnar shape may include a rod-like shape or a bar-like shape having an aspect ratio greater than 1, such as a circular column or a polygonal column, and the shape of the cross-section thereof is not limited thereto.

The light emitting element LD may have a size as small as a nanometer scale to a micrometer scale. For example, the light emitting element LD may have a diameter D (or width) and/or a length L ranging from a nanometer scale to a micrometer scale. However, the size of the light emitting element LD is not limited thereto. The size of the light emitting element LD may be variously changed according to design conditions of various devices using a light emitting device including the light emitting element LD as a light source, for example, a display device.

The first semiconductor layer 11 may be a semiconductor layer of a first conductivity type. For example, the first semiconductor layer 11 may include a p-type semiconductor layer. For example, the first semiconductor layer 11 may include a p-type semiconductor layer including at least one semiconductor material of InAlGaN, GaN, AlGaN, InGaN, and AlN and doped with a first conductivity type dopant such as Mg. However, the material constituting the first semiconductor layer 11 is not limited thereto, and various other materials may be used to form the first semiconductor layer 11.

The active layer 12 may be disposed between the first semiconductor layer 11 and the second semiconductor layer 13. The active layer 12 may include any one of a single well structure, a multi-well structure, a single quantum well structure, a multi quantum well (MQW) structure, a quantum dot structure, or a quantum wire structure, but the disclosure is not necessarily limited thereto. The active layer 12 may include GaN, InGaN, InAlGaN, AlGaN, AlN, or the like, and various other materials may be used to form the active layer 12.

In case that a voltage equal to or greater than a threshold voltage is applied to both ends of the light emitting element LD, the light emitting element LD may emit light while electron hole pairs are combined in the active layer 12. By controlling light emitting of the light emitting element LD using this principle, the light emitting element LD may be used as a light source of various light emitting devices including the pixel PXL of the display device DD.

The second semiconductor layer 13 may be disposed on the active layer 12, and may include a semiconductor layer of a different type from that of the first semiconductor layer 11. The second semiconductor layer 13 may include an n-type semiconductor layer. For example, the second semiconductor layer 13 may include an n-type semiconductor layer including any one semiconductor material of InAlGaN, GaN, AlGaN, InGaN, or AN and doped with a second conductivity type dopant such as Si, Ge, Sn, or the like within the spirit and the scope of the disclosure. However, the material constituting the second semiconductor layer 13 is not limited thereto, and various other materials may be used to form the second semiconductor layer 13.

According to an embodiment, an electrode layer may be further disposed on the first end EP1 and/or the second end EP2 of the light emitting element LD. The electrode layer may include a transparent metal or a transparent metal oxide. For example, the electrode layer may include at least one of indium tin oxide (ITO), indium zinc oxide (IZO), and zinc tin oxide (ZTO), but the disclosure is not necessarily limited thereto. As described above, in case that the electrode layer is formed of a transparent metal or a transparent metal oxide, light generated in the active layer 12 of the light emitting element LD may pass through the electrode layer to be emitted to outside of the light emitting element LD.

An insulating film INF may be provided on a surface of the light emitting element LD. The insulating film INF may be disposed on or directly disposed on surfaces of the first semiconductor layer 11, the active layer 12, and/or the second semiconductor layer 13. The insulating film INF may expose the first and second ends EP1 and EP2 of the light emitting element LD having different polarities. According to an embodiment, the insulating film INF may expose side portions of the first semiconductor layer 11 and/or the second semiconductor layer 13 adjacent to the first and second ends EP1 and EP2 of the light emitting element LD.

The insulating film INF may prevent an electrical short circuit that may occur in case that the active layer 12 comes into contact with a conductive material other than the first and second semiconductor layers 11 and 13. The insulating film INF may minimize surface defects of the light emitting elements LD to improve lifespan and light emitting efficiency of the light emitting elements LD.

The insulating film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). For example, the insulating film INF may be composed of a double layer, and each layer constituting the double layer may include a different material. For example, the insulating film INF may be composed of a double layer including aluminum oxide ($AlO_x$) and silicon oxide ($SiO_x$), but the disclosure is not necessarily limited thereto. According to an embodiment, the insulating film INF may be omitted.

A method of manufacturing the display device according to the above-described embodiments will be described.

FIGS. 13 to 19 are schematic cross-sectional views illustrating a method of manufacturing a display device according to an embodiment for each process step. FIGS. 13 to 19 show a method of manufacturing a display device based on FIGS. 1 to 9. Components substantially the same as those of FIGS. 1 to 9 are denoted by the same reference numerals, and detailed reference numerals may be omitted.

Figure 13:
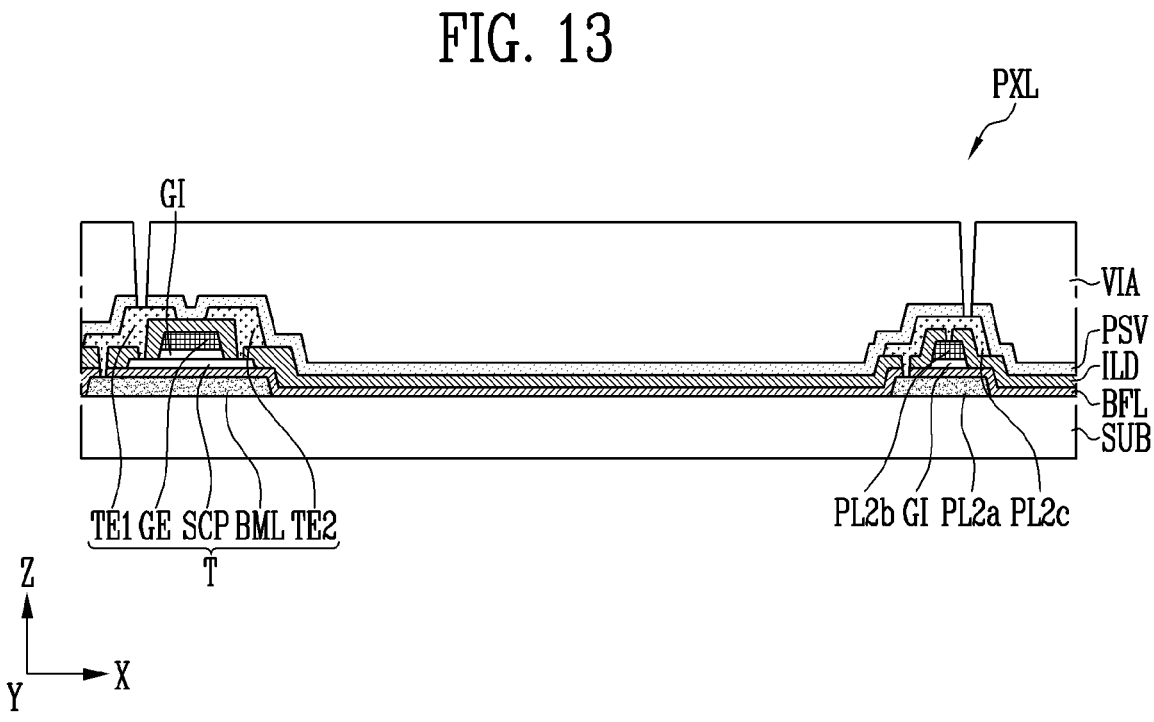
FIGS. 13 to 19 are schematic cross-sectional views illustrating a method of manufacturing a display device according to an embodiment for each process step.
Figure 14:
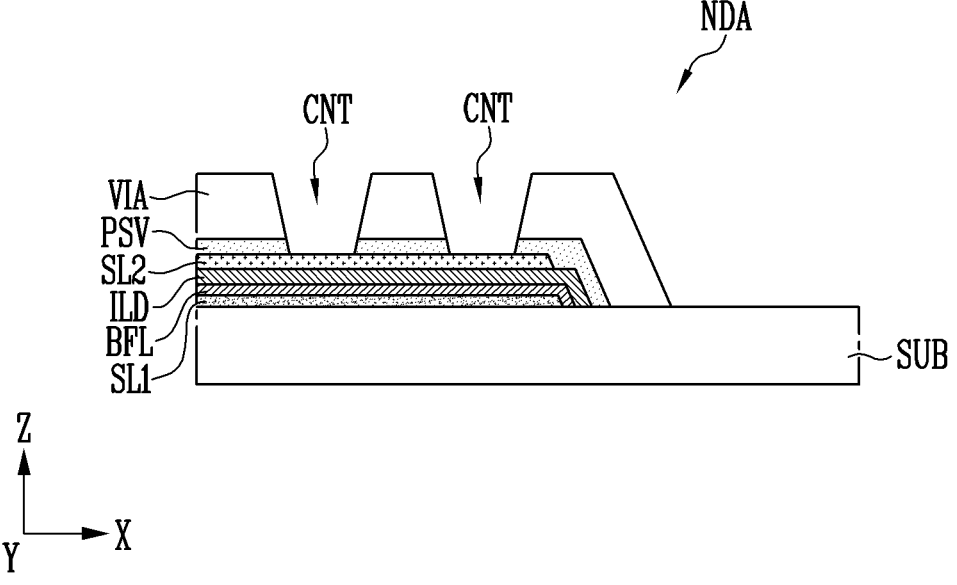

Referring to FIGS. 13 and 14, first, the passivation layer PSV and the via layer VIA may be formed on the transistor T and the signal lines SL1 and SL2. The passivation layer PSV and the via layer VIA may cover the transistor T formed in the display area DA and the signal lines SL1 and SL2 formed in the non-display area NDA. The passivation layer PSV and the via layer VIA may be etched to form contact holes. The passivation layer PSV and the via layer VIA may be simultaneously etched in the same process. The contact holes formed in the display area DA may expose the first transistor electrode TE1 and the third power source conductive layer PL2c, respectively. The contact holes CNT formed in the non-display area NDA may expose the second signal line SL2.

Figure 15:
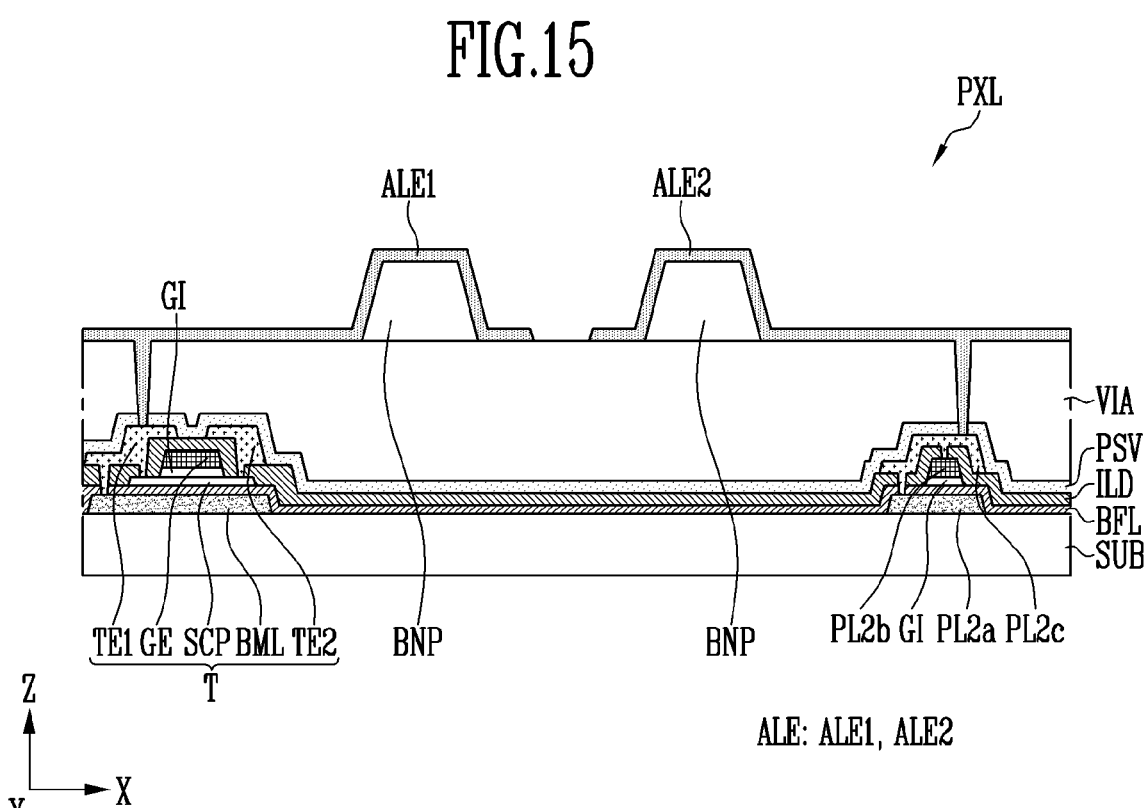
Figure 16:
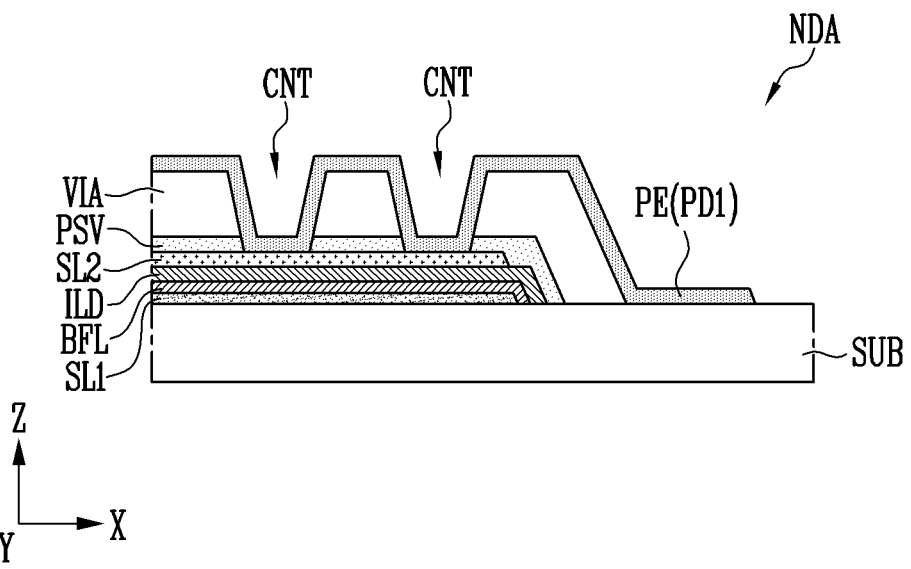

Referring to FIGS. 15 and 16, the electrodes ALE and the pad electrode PE may be formed on the via layer VIA. The electrodes ALE and the pad electrode PE may be simultaneously formed in the same process. In the display area DA, the first electrode ALE1 may be connected to the first transistor electrode TE1 of the transistor T through a contact hole penetrating the via layer VIA and the passivation layer PSV. In the display area DA, the second electrode ALE2 may be connected to the third power source conductive layer PL2c through a contact hole penetrating the via layer VIA and the passivation layer PSV. In the non-display area NDA, the pad electrode PE may be connected to the second signal line SL2 through the contact holes CNT penetrating the via layer VIA and the passivation layer PSV.

Figure 17:
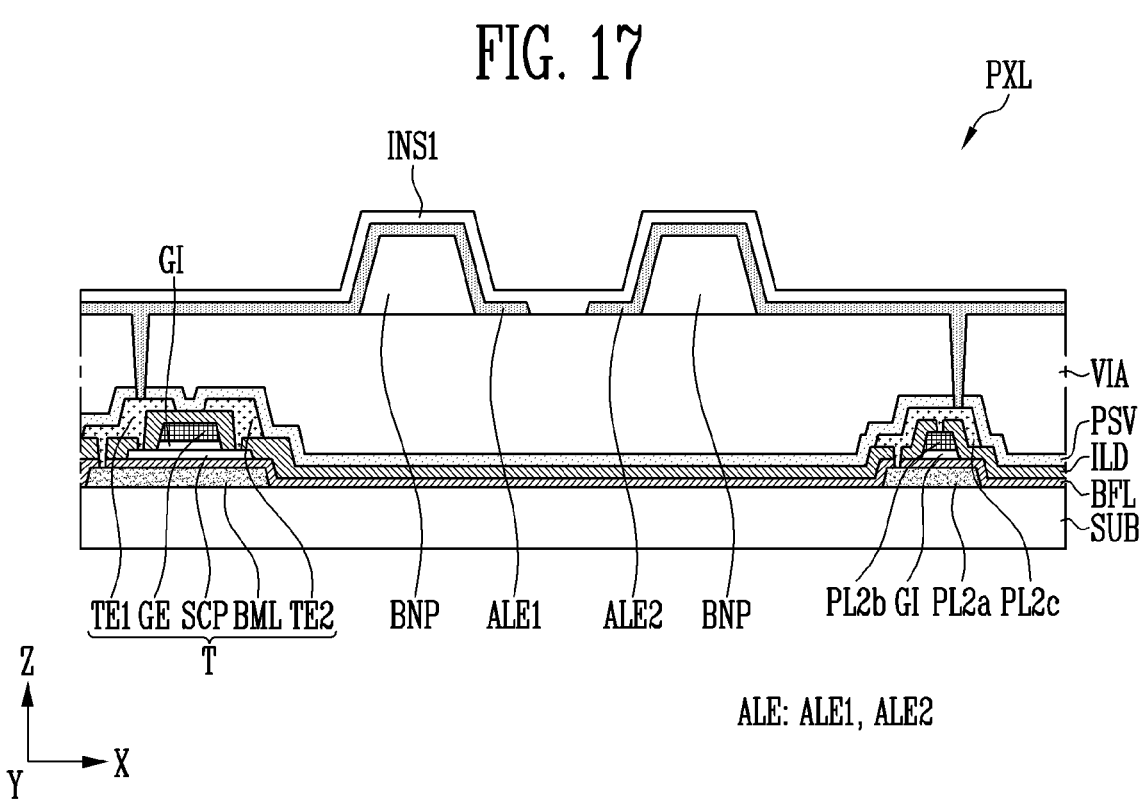
Figure 18:
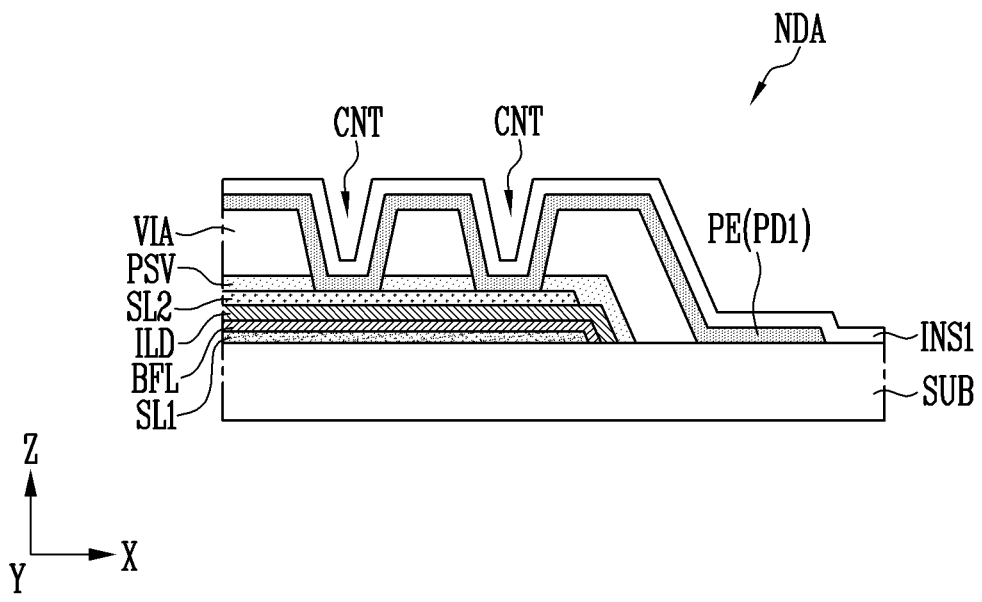

Referring to FIGS. 17 and 18, the first insulating layer INS1 may be formed on the electrodes ALE and the pad electrode PE. The first insulating layer INS1 may cover the electrodes ALE and the pad electrode PE.

As shown in FIG. 9, the opening OP may be formed in the first insulating layer INS1. The opening OP of the first insulating layer INS1 may expose the first region A1 of the pad electrode PE. The first region A1 of the pad electrode PE exposed by the opening OP of the first insulating layer INS1 may be electrically connected to the above-described circuit board FB (refer to FIG. 5) as the first pads PD1. For example, the second pads PD2 of the circuit board FB (refer to FIGS) may be electrically connected to the first region A1 of the pad electrode PE through the opening OP of the first insulating layer INS1.

The opening OP of the first insulating layer INS1 may be formed so as not to overlap the signal lines SL1 and SL2. For example, the second signal line SL2 may not overlap the first region A1 of the pad electrode PE exposed by the opening OP of the first insulating layer INS1. The second signal line SL2 may not contact the first region A1 of the pad electrode PE exposed by the opening OP of the first insulating layer INS1. According to an embodiment, the via layer VIA may not overlap the opening OP of the first insulating layer INS1.

The second region A2 of the pad electrode PE may be covered by the first insulating layer INS1. The second signal line SL2 may be electrically connected to the second region A2 of the pad electrode PE covered by the first insulating layer INS1. The second region A2 of the pad electrode PE may be connected to the second signal line SL2 through the contact holes CNT of the passivation layer PSV and the via layer VIA. The contact holes CNT of the passivation layer PSV and the via layer VIA may be covered by the first insulating layer INS1. For example, the contact holes CNT of the passivation layer PSV and the via layer VIA may not overlap the opening OP of the first insulating layer INS1. As described above, in case that the contact holes CNT through which the pad electrode PE and the second signal line SL2 are connected to each other are protected by the first insulating layer INS1, as described above, it is possible to prevent the pad electrode PE from being peeled off from the second signal line SL2 by being exposed to a chemical solution in a subsequent process.

Figures 19, 20:
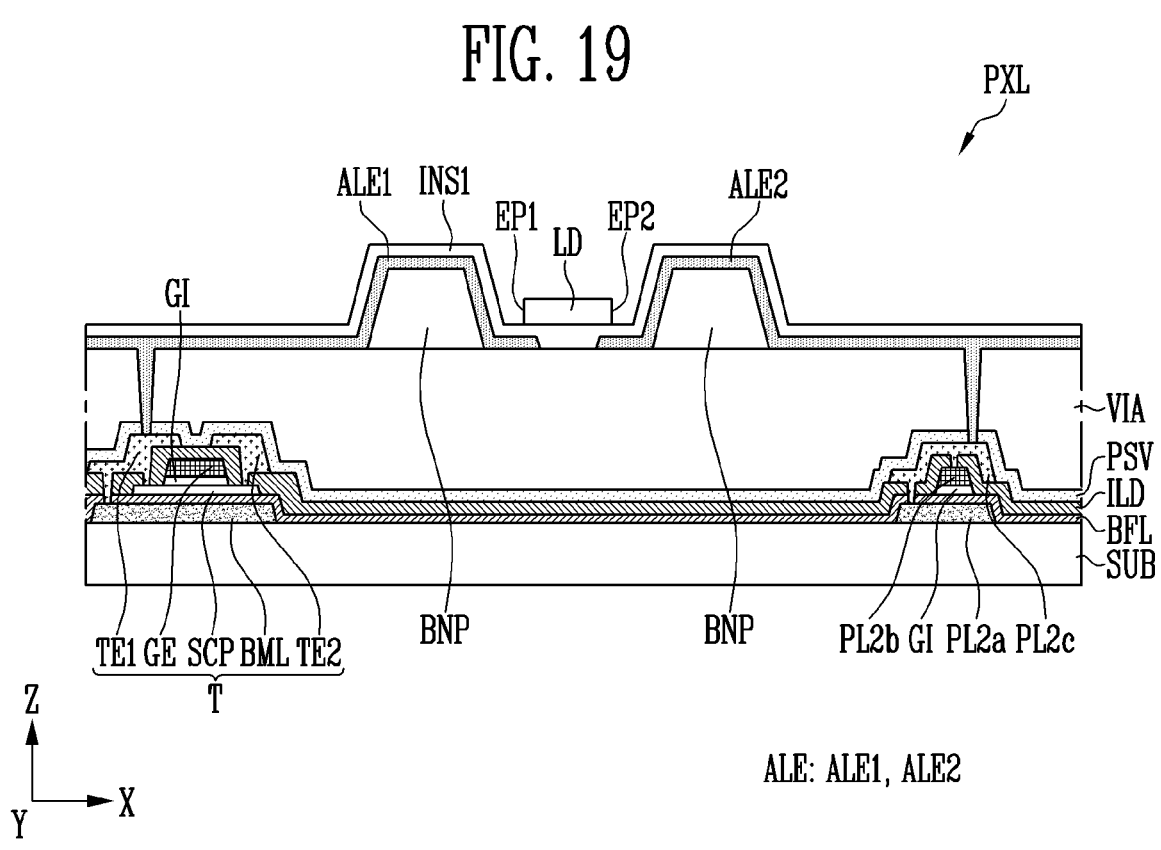
FIGS. 20 and 21 are schematic cross-sectional views illustrating a method of manufacturing a display device according to an embodiment for each process step.

Referring to FIG. 19, the light emitting elements LD may be provided between the electrodes ALE. The light emitting elements LD may be aligned between the electrodes ALE on the first insulating layer INS1. The light emitting elements LD may be prepared in a dispersed form in a light emitting element ink, and may be supplied to each pixel PXL through an inkjet printing method or the like within the spirit and the scope of the disclosure. For example, the light emitting elements LD may be dispersed in a volatile solvent and provided to each pixel PXL. In case that the alignment signal is supplied to the electrodes ALE, the electric field may be formed between the electrodes ALE to align the light emitting elements LD between the electrodes ALE. If the solvent is evaporated or the solvent is removed in another way after the light emitting elements LD are aligned, the light emitting elements LD can be stably arranged between the electrodes ALE.

The pixel PXL structure shown in FIGS. 7 and 8 may be completed by forming the second insulating layer INS2, the connection electrodes ELT, and/or the third insulating layer INS3 on the light emitting elements LD.

Hereinafter, an embodiment will be described. In the following embodiment, components that are the same as those already described are referred to by the same reference numerals, and duplicate descriptions may be omitted or simplified.

Figure 21:
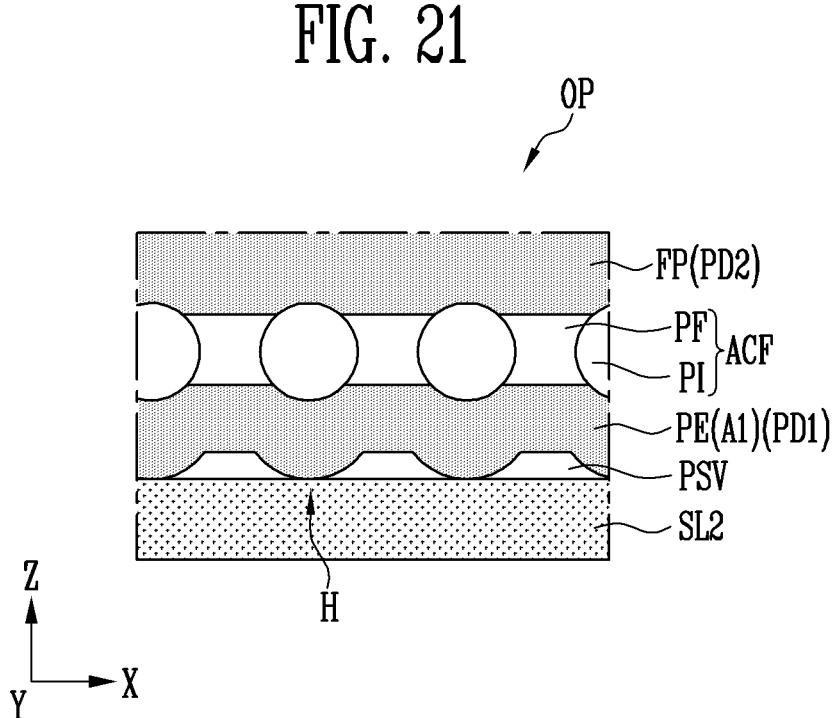

FIGS. 20 and 21 are schematic cross-sectional views illustrating a method of manufacturing a display device according to an embodiment for each process step. FIGS. 20 to 21 show a method of manufacturing a display device based on the region A of FIG. 10. Components substantially the same as those of FIG. 10 are denoted by the same reference numerals, and detailed reference numerals may be omitted.

Referring to FIG. 20, the second signal line SL2 may overlap the first region A1 of the pad electrode PE. The passivation layer PSV may be disposed between the second signal line SL2 and the first region A1 of the pad electrode PE. The second signal line SL2 may be separated from the first region A1 of the pad electrode PE by the passivation layer PSV. The display panel DP may be manufactured by performing a subsequent process in a state in which the signal lines SL1 and SL2 and the first region A1 of the pad electrode PE are separated by the passivation layer PSV. The conductive particles PI may be provided between the pad electrode PE and the circuit board FB to couple or connect the pad electrode PE and the circuit board FB. The conductive particles PI may be provided in the opening OP of the first insulating layer INS1 and provided between the first region A1 of the pad electrode PE and the second pads PD2 of the circuit board FB. The conductive particles PI may be provided between the pad electrode PE and the circuit board FB in a form included in the adhesive film PF of the conductive adhesive member ACF, but the disclosure is not necessarily limited thereto.

Referring to FIG. 21, the first pads PD1 and the second pads PD2 (or, FP) may be coupled or connected to each other by applying pressure. The conductive particles PI may electrically connect the first pads PD1 and the second pads PD2 between the first pads PD1 and the second pads PD2.

In a process of coupling or connecting the circuit board FB, a hole H may be formed in the passivation layer PSV by the pressure of the conductive particles PI. The first region A1 of the pad electrode PE may be electrically connected to the second signal line SL2 through the hole H of the passivation layer PSV. As described above, in case that the second signal line SL2 is in contact with the first region A1 of the pad electrode PE in the step of coupling or connecting the circuit board FB after performing the subsequent process in a state in which the second signal line SL2 and the first region A1 of the pad electrode PE are separated, a contact portion between the first region A1 of the pad electrode PE and the second signal line SL2 may not be exposed to the chemical solution in a subsequent process. Therefore, as described above, it is possible to prevent the first region A1 of the pad electrode PE from being peeled off from the second signal line SL2.

According to the above-described embodiments, the contact holes through which the pad electrode and the signal line are connected may be protected by the insulating layer. Therefore, it is possible to prevent the pad electrode from being peeled off from the signal line. Accordingly, damage to the pad can be minimized.

The effects according to the embodiments are not limited by the contents disclosed above, more various effects are included in the disclosure.

The technical spirit of the disclosure has been described according to the above-described embodiments. However, it should be noted that the above-described embodiments are intended to illustrate the disclosure and not to limit the disclosure. Those skilled in the art or those of ordinary skill in the art will appreciate that various modifications and changes are possible without departing from the spirit and technical scope of the disclosure.

What is claimed is:

1. A display device comprising:
   electrodes spaced apart from each other in a display area;
   an insulating layer disposed on the electrodes;
   light emitting elements disposed between the electrodes on the insulating layer;
   a signal line electrically connected to the light emitting elements; and
   a pad electrode electrically connected to the signal line, the pad electrode and the electrodes being disposed on a same layer in a non-display area, wherein
   the insulating layer includes an opening exposing the pad electrode, and
   the signal line does not overlap the opening of the insulating layer in plan view.

2. The display device of claim 1, further comprising:
   a via layer disposed between the signal line and the pad electrode.

3. The display device of claim 2, wherein the via layer includes a contact hole exposing the signal line.

4. The display device of claim 3, wherein the pad electrode is electrically connected to the signal line through the contact hole of the via layer.

5. The display device of claim 4, wherein the insulating layer covers the contact hole of the via layer.

6. The display device of claim 2, wherein the via layer does not overlap the opening of the insulating layer in plan view.

7. The display device of claim 1, further comprising:

a circuit board electrically connected to the pad electrode.

8. The display device of claim 7, wherein the circuit board includes a circuit pad electrically connected to the pad electrode through the opening of the insulating layer.

9. The display device of claim 1, further comprising:

connection electrodes electrically connected to the light emitting elements.

10. The display device of claim 9, wherein the connection electrodes are electrically connected to the electrodes.

* * * * *